(12) United States Patent
Bhatnagar et al.

(10) Patent No.: US 9,336,196 B2
(45) Date of Patent: May 10, 2016

(54) METHODS, SYSTEMS, AND APPARATUS FOR OPTIMIZATION USING STATISTICAL ESTIMATION

(71) Applicants: Vidur Shailendra Bhatnagar, Uttarakhand (IN); Sudhir Verma, Haryana (IN)

(72) Inventors: Vidur Shailendra Bhatnagar, Uttarakhand (IN); Sudhir Verma, Haryana (IN)

(73) Assignee: SAP SE, Walldorf (DE)

( * ) Notice: Subject to any disclaimer, the term of this patent is extended or adjusted under 35 U.S.C. 154(b) by 388 days.

(21) Appl. No.: 14/098,706

(22) Filed: Dec. 6, 2013

(65) Prior Publication Data

US 2015/0161100 A1      Jun. 11, 2015

(51) Int. Cl.
| | | |
|---|---|---|
| *G06N 5/00* | (2006.01) | |
| *G06F 17/27* | (2006.01) | |
| *G06F 17/30* | (2006.01) | |
| *H03M 7/30* | (2006.01) | |

(52) U.S. Cl.
CPC ...... *G06F 17/2735* (2013.01); *G06F 17/30315* (2013.01); *G06N 5/00* (2013.01); *H03M 7/3088* (2013.01)

(58) Field of Classification Search
None
See application file for complete search history.

(56) References Cited

U.S. PATENT DOCUMENTS

| | | | |
|---|---|---|---|
| 4,979,109 A | | 12/1990 | Tanaka et al. |
| 5,210,853 A | * | 5/1993 | Nakasuji ............ G06F 15/0283 |
| 5,333,313 A | | 7/1994 | Heising |
| 5,956,724 A | | 9/1999 | Griffiths |
| 6,804,680 B2 | | 10/2004 | Melli |
| 7,496,589 B1 | | 2/2009 | Jain et al. |
| 7,577,679 B2 | | 8/2009 | Sinclair |
| 7,868,789 B1 | * | 1/2011 | Binnig ............ G06F 17/30454 341/51 |
| 8,032,499 B2 | | 10/2011 | Faerber et al. |
| 8,051,045 B2 | | 11/2011 | Vogler |
| 8,145,662 B2 | | 3/2012 | Chen et al. |
| 8,326,810 B2 | | 12/2012 | Faerber et al. |
| 8,352,510 B2 | | 1/2013 | Bornhoevd et al. |
| 8,627,006 B2 | * | 1/2014 | Potapov .................. 707/810 |
| 2010/0030796 A1 | | 2/2010 | Netz et al. |
| 2010/0281004 A1 | * | 11/2010 | Kapoor ............ G06F 17/30501 707/693 |
| 2010/0318903 A1 | * | 12/2010 | Ferren .................. G06F 17/2735 715/259 |
| 2012/0221528 A1 | | 8/2012 | Renkes et al. |
| 2012/0323927 A1 | | 12/2012 | Froemmgen |
| 2013/0151567 A1 | | 6/2013 | Ellison et al. |
| 2014/0188818 A1 | * | 7/2014 | Hirsch .................. G06F 3/0641 707/692 |

FOREIGN PATENT DOCUMENTS

| | | | |
|---|---|---|---|
| EP | 1859370 A1 | 11/2007 | |
| WO | WO 2005072047 A2 | 8/2005 | |

OTHER PUBLICATIONS

Mamede et al, Range Queries in Natural Language Dictionaries with Recursive Lists of Clusters, 2007.*
"European Application Serial No. 14192703.8, Office Action mailed May 8, 2015", 4 pgs.
Rudko, Liliya, "Column-Oriented Database Systems", (2012), 40 pgs.

* cited by examiner

*Primary Examiner* — Stanley K Hill
*Assistant Examiner* — Mikalya Chubb
(74) *Attorney, Agent, or Firm* — Schwegman Lundberg & Woessner, P.A.

(57) ABSTRACT

Methods, apparatus, systems, and computer program products for utilizing a split dictionary are described. A mean and a standard deviation of a length of a plurality of records in a dictionary may be computed. A split condition may be determined based on the computed mean and the computed standard deviation. The dictionary may be split into a plurality of split dictionaries based on the split condition.

18 Claims, 19 Drawing Sheets

| TABLE NAME | COLUMN NAME | DICTIONARY START ADDRESS | ENCODING INTEGER LENGTH (IN BITS) | WIDTH OF THE STRING COLUMN | TOTAL NUMBER OF STRINGS IN THE DICTIONARY |
|---|---|---|---|---|---|
| SUPPLIERS | CITY | 000XXX01 | 20 | 100 | 1000000 |

*FIG. 2A*

| PARAMETER | VALUE |
|---|---|
| TOTAL NUMBER OF RECORDS | 932000 |
| LONGEST STRING LENGTH | 91 CHARACTERS |
| SPECIFIED COLUMN WIDTH | 91 CHARACTERS = 91 BYTES |
| AVERAGE LENGTH OF STRINGS | 10.16 CHARACTERS ~ 11 BYTES |
| STANDARD DEVIATION IN LENGTH OF STRINGS | 4.20 CHARACTERS |
| TOTAL DICTIONARY SIZE | 932000 * 91 BYTES = 80.88 MB |
| DICTIONARY PERFORMANCE (CONSIDERING A 2MB/ms/CORE PERFORMANCE) | 80.88 / 2 = 40.44 ms |
| TOTAL SPACE WASTED | 80.88 MB - (11 BYTES * 932000 MILLION) = 80.88 - 9.78 MB = 71.10 MB |

*FIG. 2B*

| TABLE NAME | COLUMN NAME | DICTIONARY START ADDRESS | ENCODING INTEGER LENGTH (IN BITS) | WIDTH OF STRING COLUMN (IN BITS) | COUNT OF STRINGS |
|---|---|---|---|---|---|
| SUPPLIERS | CITY | 000XXX01 | 20 | 25 | 997000 |
| SUPPLIERS | CITY | 00022222 | 20 | 100 | 3000 |

METHODS, SYSTEMS, AND APPARATUS FOR OPTIMIZATION USING STATISTICAL ESTIMATION

FIELD

The present disclosure relates, generally, to data compression and search. In an example embodiment, the disclosure relates to data dictionary compression and search for data in data dictionaries and transaction tables.

BACKGROUND

Enterprise data is growing rapidly and enterprises are looking for ways to utilize big data to gain a competitive advantage. Databases have traditionally used data compression models to make data easily consumable. In general, the major barrier in data compression is that, as the compression ratio increases, so does the complexity; a higher compression ratio often means that it is more difficult to decompress the data. An optimal compression technique would be one that can provide a high compression ratio, but still not consume excessive computer resources to query the data for analytics.

Many conventional compression algorithms, such as null suppression, Huffman, and the like may provide 50 to 85% compression rates, but may be complex and the decompression of data may be a time intensive process. Nonetheless, these techniques may be efficient in reducing the I/O (input/output) overhead and hence may be suitable for I/O bound applications. In contrast, in the case of more light-weight compression techniques such as data dictionary compression, run-length, delta encoding, and the like, the I/O benefits of compression may substantially outweigh the associated processing costs.

Compression techniques have evolved from row-based compression approaches to column-based compression schemes, as column stores have natural redundancy in data values due to a recurrence of data values or patterns. Such techniques make decompression or consumption of data relatively easier. In column stores, a high compression ratio can be achieved compared to traditional row-oriented database systems. This may result in reduced storage needs, improved performance (for I/O intensive applications), and an increase in buffer pool/cache hit rate.

In the particular case of dictionary encoding, values of a column are encoded as integers. Thus, a check for equality, during scans or join operations, can be executed on integer parameters, which may be much faster than comparing string values. Furthermore, the dictionary encoded attribute vectors may be compressed using various techniques, like prefix encoding, run-length encoding, cluster encoding, and the like. In addition, the dictionaries themselves may be compressed through methods like delta encoding compression.

BRIEF DESCRIPTION OF DRAWINGS

The present disclosure is illustrated by way of example and not limitation in the figures of the accompanying drawings, in which like references indicate similar elements and in which:

FIG. 2A illustrates a table showing example master metadata, in accordance with an example embodiment;

FIG. 2B illustrates a table showing an example city dataset, in accordance with an example embodiment;

DETAILED DESCRIPTION

The description that follows includes illustrative systems, methods, techniques, instruction sequences, and computing program products that embody example embodiments of the present invention. In the following description, for purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures and techniques have not been shown in detail.

Generally, methods, systems, apparatus, and computer program products for generating and processing dictionary tables are disclosed. In one example embodiment, dictionary tables are compressed through the use of statistical estimation techniques in order to reduce an amount of unused storage space allocated to the dictionary table. In one example embodiment, techniques to improve attribute vector (AV) query performance without losing the record identifier (e.g., row/record-id) are disclosed. The disclosed techniques may preserve the ability to directly access elements of the dictionary tables without increasing the utilization of computing resources.

Multi-Tiered Enterprise Computing Systems

Figure 1A:
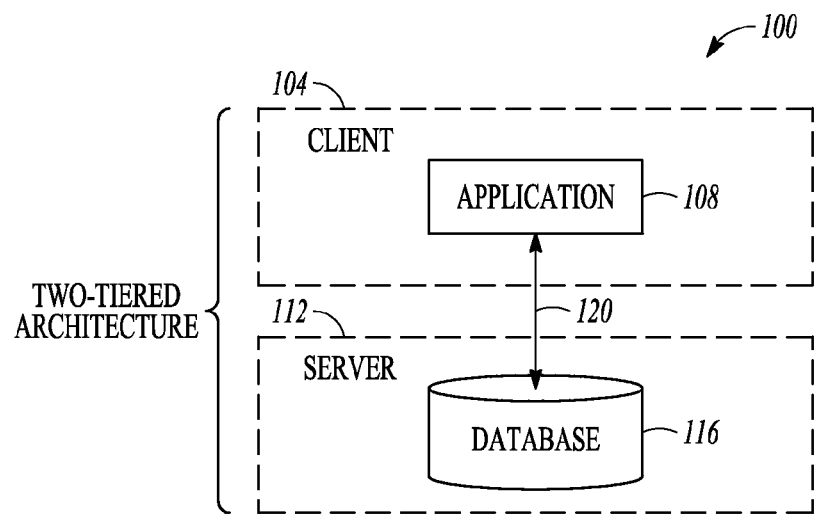
FIGS. 1A and 1B illustrate schematic diagrams of example systems for data compression and search, in accordance with an example embodiment.
Figure 1B:
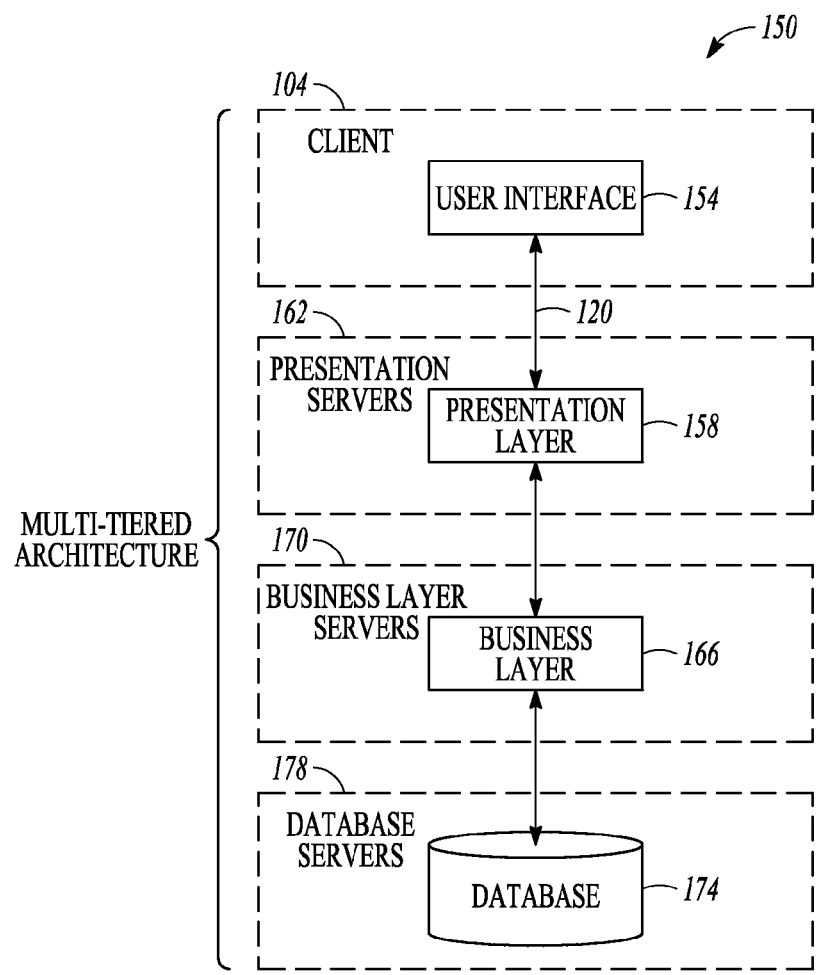

FIGS. 1A and 1B illustrate schematic diagrams of example systems 100, 150 for utilizing data dictionaries, in accordance with an example embodiment. Traditional client-server systems may employ a two-tiered architecture such as that illustrated by system 100 in FIG. 1A. Application 108 executed on the client 104 of the two-tiered architecture may be comprised of a monolithic set of program code including a graphical user interface component, presentation logic, business logic and a network interface that enables the client 104 to communicate over a network 120 with one or more servers 112. A database 116 may be maintained on the server 112 that provides non-volatile or "persistent" storage for the data accessed and/or processed by the application 108.

The "business logic" component of the application 108 may represent the core program code of the application 108, i.e., the rules governing the underlying business process (or other functionality) provided by the application 108. The "presentation logic" may describe the specific manner in which the results of the business logic are formatted for display on the user interface. The "database" 116 may include data access logic used by the business logic to store and retrieve data.

In response to limitations associated with the two-tiered client-server architecture, a multi-tiered architecture has been developed, as illustrated in FIG. 1B. In the multi-tiered system 150, the presentation layer 158, business layer 166 and database 174 may be logically separated from the user interface 154 of the application. These layers may be moved off of the client 104 to one or more dedicated servers on the network 120. For example, the presentation layer 158, the business layer 166, and the database 174 may each be maintained on separate servers (e.g., presentation servers 162, business layer servers 170 and database servers 178).

This separation of logical components and the user interface 154 may provide a more flexible and scalable architecture compared to that provided by the two-tiered model of the system 100 in FIG. 1A. For example, the separation may ensure that all clients 104 share a single implementation of business layer 166. If business rules change, changing the current implementation of business layer 166 to a new version may not call for updating any client-side program code. In addition, the presentation layer 158 may be provided, which generates code for a variety of different user interfaces 154, which may be standard browsers.

For example, consider the following query:
SELECT COUNT (*) FROM Suppliers WHERE City='Delhi'.
To execute the above query, a system may have a master metadata table working in conjunction with a database manager to store information like table name, column name, start address of the dictionary, width of the string column in the dictionary, total number of records in the dictionary, encoding integer width, and the like. FIG. 2A illustrates a table showing example master metadata, in accordance with an example embodiment. The table of FIG. 2A comprises a title name, a column name, a start address for the corresponding dictionary, an encoding integer length, a width of the string column, and a count of the total number of strings in the dictionary. In the above query, the table name is "Suppliers" and the column is "City." To perform the query, the system may access the master metadata table to determine the location of the dictionary table and to find the integer identifier (ID) of the unique city string which equals "Delhi."

In one example embodiment, the width of the string column may be useful in calculating the integer ID (used in the attribute vector), as the integer ID for each entry in the dictionary is equivalent to its memory offset from the start address of the dictionary. In this case, to perform the query, values in the dictionary are traversed using integral multiples of the string column width in search of the query term. For example, the term "Delhi" may be searched for. If a match is found, the integer ID is further used to scan the attribute vector to find the total count of entries that match the name "Delhi."

Dictionary Table Compression

The number of unique strings in a dictionary table may be on the order of millions. In such instances, searching for a particular string in the dictionary may lead to performance degradation. To overcome this shortcoming, the dictionary tables may be compressed. For example, the dictionary tables may be compressed using delta encoding.

Challenges in Delta Encoding

Delta encoding algorithms may be used for compressing dictionary tables in terms of space requirements. Delta encoding may lead to degraded performance since compression creates varying column length vectors that complicate the calculation of the integer ID. To improve the performance, a master metadata record may be created to store the variable lengths of each unique string. The stored variable lengths may be used to traverse the dictionary while reading table entries while, for example, searching for a particular string.

The use of delta encoding for dictionary tables may, however, present various issues. For example, columns of a fixed width may provide a natural delimiter of the records. A characteristic of using delta encoding may be that each record is variable in length and thus there may be no natural record delimiting the records. This may make it complex to reconstruct the original record using the dictionary, as the address of the desired string cannot be easily computed.

For particular queries, like substring matching, where the entire dictionary needs to be sorted, delta compression may lead to severe performance degradation as decompression of data may be a complex procedure.

For queries involving an exact string search in the dictionary, generally, binary search algorithms may be implemented. If the dictionary is compressed using delta encoding, then traversing the compressed dictionary from one (middle) element to the next (middle) element in the search space becomes a challenge (as the computation of the same may be expensive). For example, consider that the search pointer is currently on the $11^{th}$ dictionary element (sorted and compressed) and it needs to reach the $6^{th}$ element to compare the query parameter with the string (since a binary search requirement is to split the search space in half). Based on this comparison, the search pointer either moves to the $3^{rd}$ position or the $8^{th}$ position for the next match. To calculate the memory address of the $6^{th}$ record, it needs to get the length of the first 5 records and sum them to reach the beginning of the 6$^{th}$ element. This may be computationally expensive.

In one example embodiment, a modified version of delta compression known as block delta compression may be implemented, in which the dictionary is stored as sorted blocks of 16 string values that are compressed using the delta compression technique. To search a string in the block delta dictionary, a binary search may be performed at the block level and then a linear search may be performed once a block is selected. A direct access to the blocks may be maintained using an index/metadata table, leading to a slight overhead in terms of space requirements. This may improve the performance of searching for a string in the dictionary as compared to pure delta encoding, but it may compromise the compression ratio.

As the size of the dictionary increases, the size of the prefixed encoding parameters, namely, the overlap length and new string length, may increase in proportion. This may result in a larger memory being needed to store the delta encoded dictionary. Consequently, a larger number of bits may be needed to address it in the metadata table.

Delta encoding may further complicate the update of new and unique string entries in the dictionary. In a simple dictionary, a new string may be simply inserted in between existing entries and the memory may be re-adjusted for the trailing strings. In the case of delta encoding, in addition to the memory re-adjustment, the delta/overlap length needs to be recomputed for the new entry and the immediate next string. If an index/metadata table is maintained, even that may have to be updated for all of the trailing strings (following the new entry).

In addition, since the records are now variable in length, the task of finding the next record entry may become more complex.

Furthermore, null suppression, like delta encoding or any other approach that results in variable length columns/fields, may eliminate direct access to columns of records.

Split Dictionary Approach

The default width of a column in a table is set such that it can accommodate the maximum length of a string. The memory allocations in a conventional dictionary are done as per the fixed column width (maximum length) defined in the database table. This may lead, however, to a waste of storage space, as strings which are shorter in length than the maximum length do not utilize the entire width of the column. FIG. 2B illustrates a table showing an example city dataset, in accordance with an example embodiment. The column width allocated to the dictionary is 91 bytes (characters), leading to a total space requirement of 80.88 MB. The average length of the strings, however, is only 11 bytes, resulting in memory wastage of 87.90% (71.10 MB).

Figure 3A:
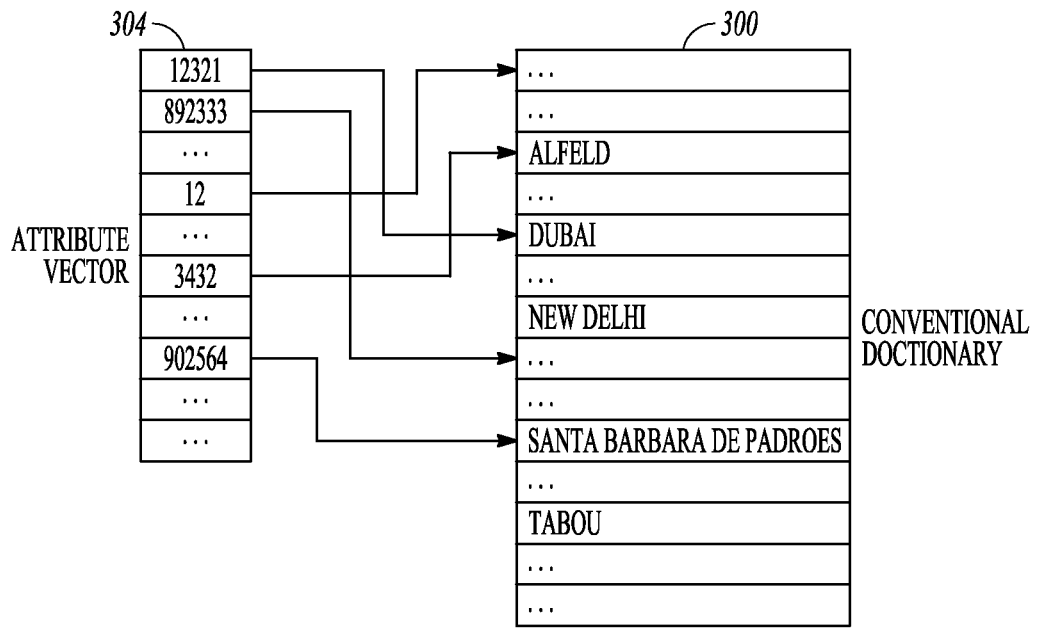
FIG. 3A illustrates an example conventional attribute vector and a dictionary, in accordance with an example embodiment.
Figure 3B:
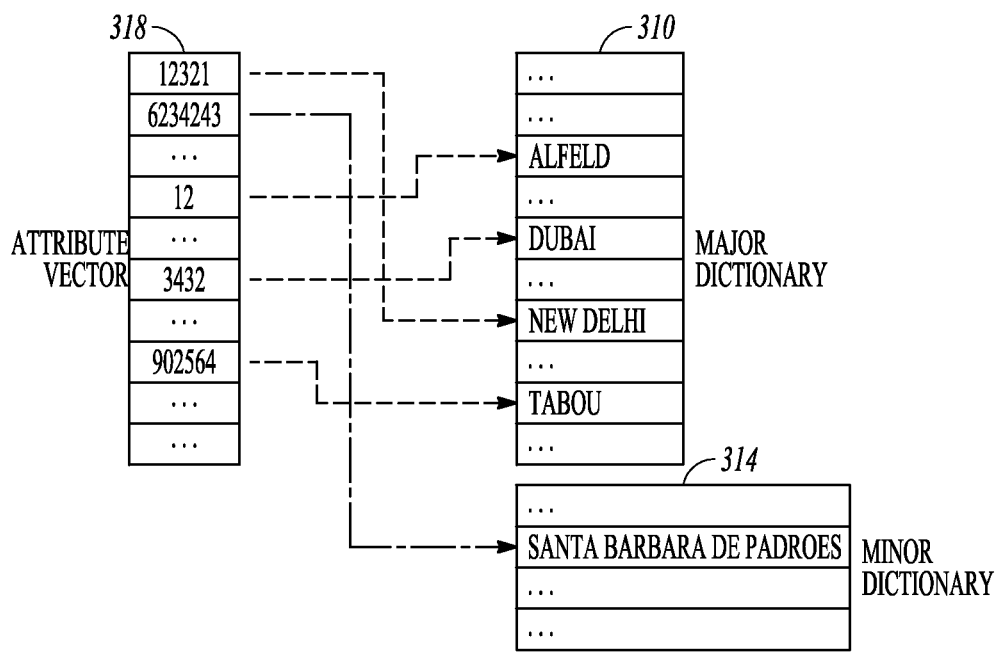
FIG. 3B illustrates an example decomposition of the dictionary table of FIG. 3A into two tables based on the length of unique strings, in accordance with an example embodiment.

Most of the current columnar database compression schemes focus only on representing data more concisely, without losing information by exploiting the statistical redundancy in data, like a recurrence of values. In one example embodiment, the unutilized storage space for shorter length strings may be reduced through a reorganization of the dictionary tables. The reorganization may comprise splitting the dictionary tables into two tables based on the length of unique strings, where each split dictionary table has a fixed column width that is based on the spread of the record lengths it is going to contain. FIG. 3A illustrates an example conventional attribute vector 304 and a dictionary 300, in accordance with an example embodiment. The dictionary 300 comprises a number of elements; each element may contain a different number of characters. FIG. 3B illustrates an example decomposition of the dictionary table of FIG. 3A into two tables based on the length of unique strings, in accordance with an example embodiment. A major dictionary 310 may contain the elements from the dictionary 300 that are shortest in length and a minor dictionary 314 may contain the elements from the dictionary 300 that are longest in length.

Considering the central limit theorem, which states that the distribution of the sum (or average) of a large number of independent, identically distributed variables will be approximately normal (regardless of the underlying distribution), the lengths of millions of strings in a dictionary table can be safely assumed to be normally distributed. A result of a normal distribution is that most of the values may lie close to the mean due to the bell shape of the distribution curve. In statistics, the 68-95-99.7 rule, or the three-sigma rule, states that, for a normal distribution, nearly all the values lie within 3 standard deviations of the mean. Therefore, ideally, 99.7% of the total records of a dictionary should have lengths less than:

$$\text{Mean of lengths} + (\text{Constant} * \text{Standard Deviation of lengths}) = m + K*s \quad (1)$$

In equation (1), constant (K)=3.

In one example embodiment, the mean and standard deviation in length of all the strings in the dictionary are computed. Based on these calculations, the master dictionary table may be split into two parts, one having a reduced column width to accommodate the majority (possibly 99.7%) of all of the strings with length less than the mean length plus three times the standard deviation length (henceforth referred to as the "major" dictionary table) and the other having a non-reduced column width to accommodate the minority (possibly 0.3%) of all of the strings with length greater than the mean length plus three times the standard deviation length (henceforth referred to as the "minor" dictionary table). The strings in the minor table have lengths that significantly deviate from the mean of lengths. This leads to a reduction in memory space needed to store the dictionary 300 while maintaining direct access. The major and minor dictionaries 310, 314 are individually maintained as sorted dictionary tables for better performance (as done in the conventional single dictionary 300 approach).

Figures 3C, 4:
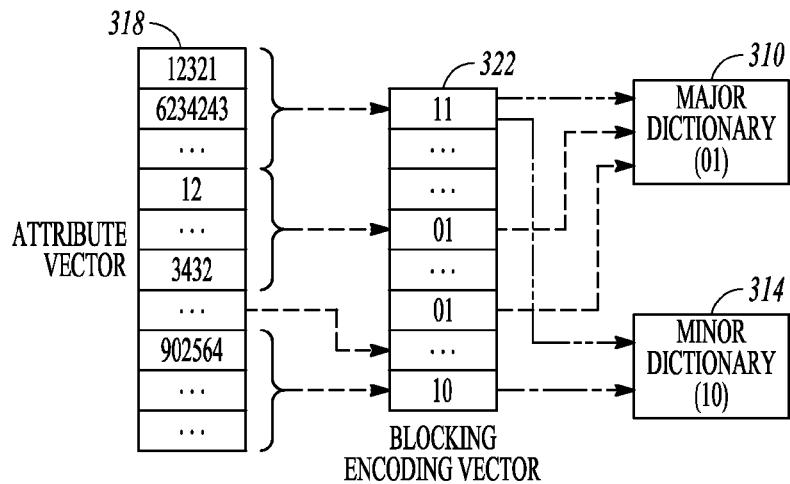
FIG. 3C shows a block encoding vector which may store information for clusters of integer identifiers within the attribute vector, in accordance with an example embodiment.
FIG. 4 illustrates a table showing an example master metadata table for a split dictionary, in accordance with an example embodiment.

In one example embodiment, information for two dictionaries 310, 314 for a single table column may be maintained. For example, information for two dictionaries 310, 314 for a single table column may be maintained in a database manager. FIG. 4 illustrates a table showing an example master metadata table for a split dictionary, in accordance with an example embodiment. The table of FIG. 4 comprises a title name, a column name, a start address for each of the corresponding major and minor dictionaries 310, 314, an encoding integer length for each dictionary 310, 314, a width of the string column for each dictionary 310, 314, and a count of the total number of strings in the dictionary 300.

Figure 5A:
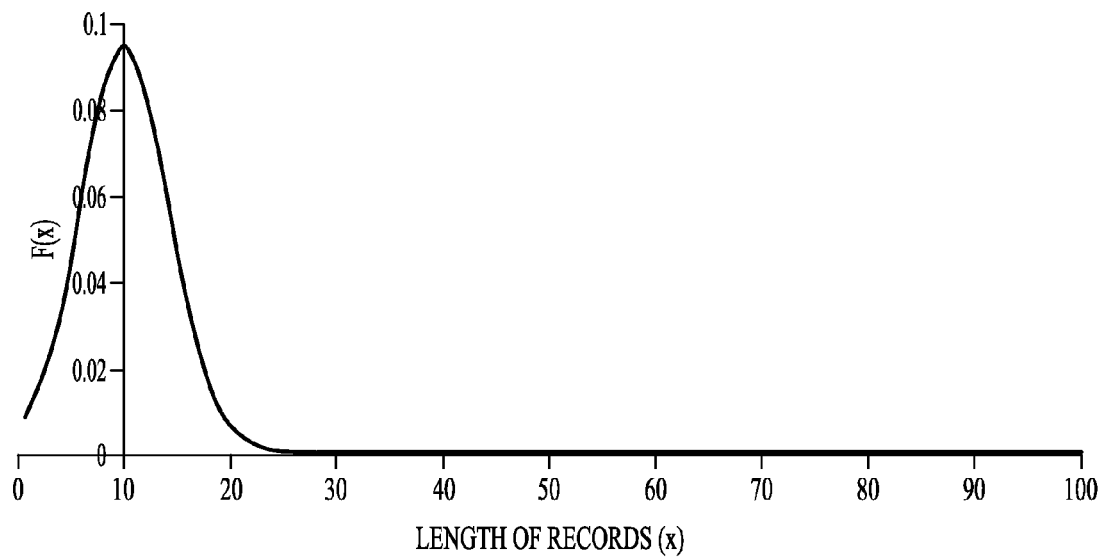
FIGS. 5A and 5B show distribution plots of example large datasets for a cities and names dictionary, respectively, in accordance with an example embodiment.
Figure 5B:
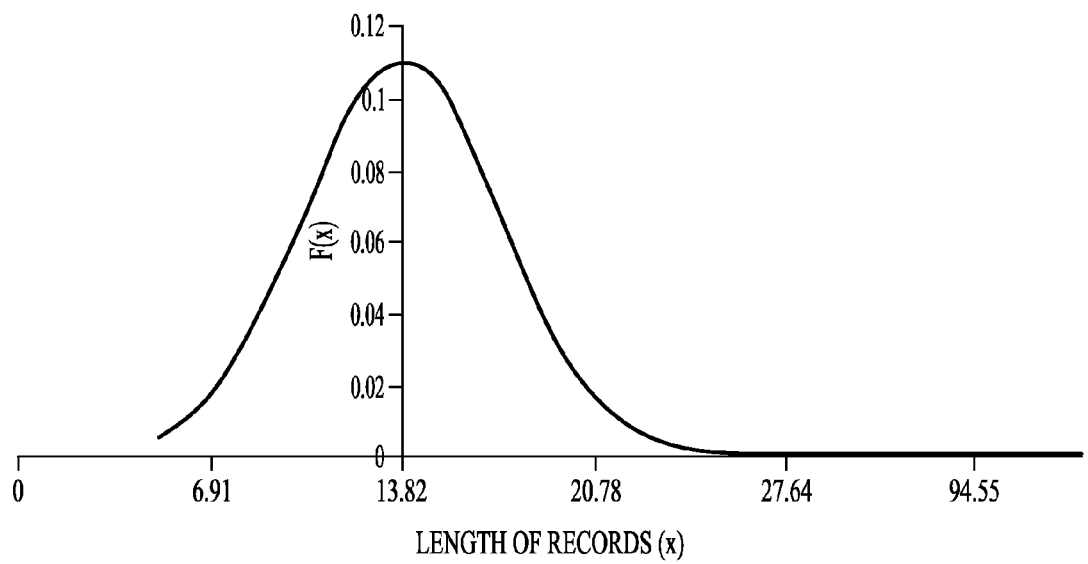

FIGS. 5A and 5B show distribution plots of example large datasets for a cities and names dictionary, respectively, in accordance with an example embodiment. Both distribution plots satisfy the central limit theorem within acceptable variations for real life data. The total number of unique strings in both the datasets is nearly 1 million. In the case of the city dictionary, 1% of the total strings (nearly 9762 strings) were assigned to the minor dictionary 310 at mean plus three times standard deviation.

Creation of Block Encoding Vector for the Attribute Vector

In one example embodiment, a block encoding vector is created for an attribute vector. For example, consider a case in which 8 billion records may be stored, one for each individual of the world's population. The attribute vector for the name column in this case may need 20 bits to store an integer identifier. This may require a total of approximately 18.63 GB of memory space. If a query for a particular name is executed, such as:

SELECT COUNT (*) FROM Suppliers WHERE Name='Robert', the search space for the equivalent integer identifier of the "Name" parameter in the attribute vector is on the order of eight billion. Since the database system already knows the search parameter's length (20 bits), the search space can be reduced, as described more fully below.

FIG. 3C shows a block encoding vector 322 which may store information for clusters of integer identifiers within the attribute vector, in accordance with an example embodiment. For this purpose, the attribute vector is considered as 'N' continuous blocks of fixed size (e.g., blocks containing 1024 integer values). The block encoding vector 322 entry for an attribute block may represent whether that block contains integer identifiers from a single dictionary or from both the major and minor dictionaries 310, 314. The system can then utilize this information for improved search performance.

In one example embodiment, the system creates three types of blocks, such as a major dictionary block, a minor dictionary block, and a mixed dictionary block (i.e., a block which contains integer identifiers from both the major and minor dictionaries 310, 314). A 2-bit vector may be used for storing clustering information of the attribute vector in the block encoding vector 322. In this vector, a value of '01' may represent a block containing only integer identifiers from the major dictionary 314, a value of '10' may represent a block containing only integer identifiers from the minor dictionary 310, a value of '11' may represent a block containing integer identifiers from both the major and minor dictionaries 310, 314, and the value of '00' may represent blocks of null values (in case a particular column allows null values).

In FIG. 3C, a dashed line represents major blocks, a single dotted line represents minor blocks, and a double dotted line represents mixed blocks. The clustering information is computed for each of the N blocks of the attribute vector. For the example of the world's population described above, 7,812,500 blocks of 1024 integer values each may be created. The memory space needed to store the block encoded vector is about 1.86 MB (i.e., 7,812,500 two-bit vectors). In one example embodiment, only two types of blocks exist (e.g., a block which contains integer identifiers from both the major and minor dictionaries 310, 314 and a block which contains integer identifiers from only the major dictionary 314), then a 1-bit vector may be sufficient to store the cluster information and the memory space needed to store the block encoded vector is reduced further.

Continuing with the world's population example, suppose a query of the name 'Robert' is submitted. The name 'Robert' has a length of six characters corresponding, in the present example, to six bytes. The length of six bytes is less than the mean length plus three times the standard deviation length and the name 'Robert' is therefore located in the major dictionary 314. Therefore, only clusters corresponding to the major dictionary 314 (two-bit vector equals '01') or corresponding to both dictionaries 310, 314 (two-bit vector equals '11') need to be searched; clusters corresponding to the minor dictionary 310 (two-bit vector equals '10') and corresponding to blocks which represent null values (two-bit vector equals '00') may be skipped. The block encoding vector information may be used to identify the cited clusters.

Performance Examples

Based on the combination of the types of blocks and the type of query, different scenarios may be contemplated to understand the performance improvements.

For example, in scenario #1, assume there are an equal number (approximately 47.5%) of major and minor dictionary blocks, and approximately 5% of the blocks are mixed dictionary blocks. The search space of the attribute vector will be equal to 47.5% major blocks, 47.5% minor blocks, and 5% mixed blocks, irrespective of whether the search parameter belongs to the major or the minor dictionary 310, 314. Thus, instead of scanning the entire attribute vector of 18.63 GB, the search space is limited to 9.78 GB. Assuming a processing speed of 2 MB/ms/core, a performance gain of almost 47.5% is achieved.

For example, in scenario #2, assume there are an equal number (approximately 33.3%) of major, minor, and mixed dictionary blocks. The search space of the attribute vector will be equal to 33.3% of major, minor, and mixed blocks, irrespective of the type of query parameter. Thus, instead of scanning the entire attribute vector of 18.63 GB, the search space is limited to 12.29 GB. Assuming a processing speed of 2 MB/ms/core, a performance gain of almost 34% is achieved.

For example, in scenario #3, assume there are an equal number (approximately 10-20%) of major and minor dictionary blocks, and approximately 70% of the blocks are mixed dictionary blocks. The search parameter belongs to the major (or minor) dictionary 310, 314. The search space of the attribute vector is limited to 70% of mixed dictionary blocks and 10-20% major (or minor) dictionary blocks. The limiting factor for performance gain in this case is the size of the mixed dictionary. Therefore, any variations in the performance are only due to the size of the remaining major and minor dictionary blocks. The performance gain in this case is between 10 and 20% depending on the size of the major and minor dictionary blocks and whether the search is in the major or the minor dictionary 314, 310.

For example, in scenario #4, assume there are a higher number (e.g., approximately 70%) of either major or minor dictionary blocks and the remaining blocks (minor/major and mixed dictionary blocks) are each approximately 10% to 20% of the total. The search parameter belongs to the major (or minor) dictionary 314, 310 and there are a higher number of major (or minor) dictionary blocks only. The search space of the attribute vector is limited to the 70% major (or minor) blocks and 10% mixed blocks. The performance gain in this case is about 20% as compared to the full attribute vector scan, as the search space is reduced to 14.90 GB.

Alternatively, the search parameter belongs to the minor (or major) dictionary 310, 314, but there are a higher number of major (or minor) dictionary blocks. The search space is effectively limited to 20% minor (or major) blocks and 10% mixed blocks. This may be the best scenario in terms of performance, as only 5.59 GB of memory space needs to be scanned, instead of 18.63 GB. This may lead to a performance gain of almost 70%, and the gain can further increase as the size of corresponding blocks decrease.

The following inferences may be drawn from the above examples:

1) The overall system performance gain may be constant in scenarios #1 and #2, regardless of the combination of different types of queries (searching on major or minor dictionary 310, 314), as the search space may be equally reduced in both the cases.
2) Within scenarios #1 and #2, the former is better for overall performance as the mixed dictionary blocks may be very low in number.
3) In scenarios #3 and #4, with varying combinations of different types of queries, approximately 10 to 70% performance gain may be attained.

Overall, a small memory allocation of 1.86 MB (0.00976% of the overall attribute vector) for the block encoding vector 322 may lead to a performance gain of 10% to 70% (based on the combination of different types of queries).

Figure 6:
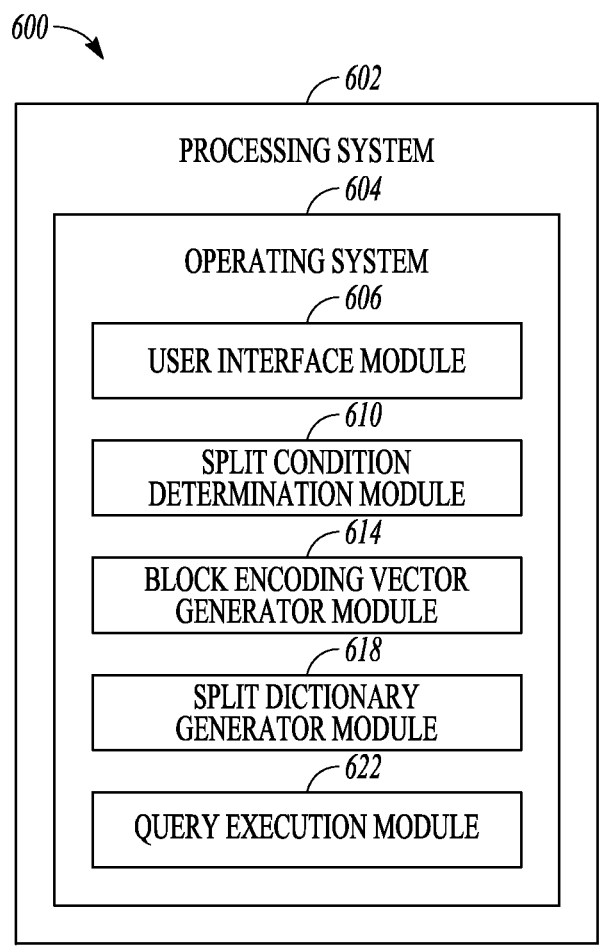
FIG. 6 is a block diagram of an example apparatus for generating and utilizing a split dictionary, in accordance with an example embodiment.

FIG. 6 is a block diagram of an example apparatus 600 for generating and utilizing a split dictionary, in accordance with an example embodiment. For example, the apparatus 600 may be used to generate and perform queries utilizing a split dictionary.

The apparatus 600 is shown to include a processing system 602 that may be implemented on a server 112, client 104, or other processing device that includes an operating system 604 for executing software instructions. In accordance with an example embodiment, the apparatus 600 may include a user interface module 606, a split condition determination module 610, a block encoding vector generator module 614, a split dictionary generator module 618, and a query execution module 622.

The user interface module 606 may enable a user to enter a query and view query results.

The split condition determination module 610 may determine a split condition, such as a split length, for a split dictionary, as described more fully below in conjunction with FIGS. 7 and 8.

Figure 9:
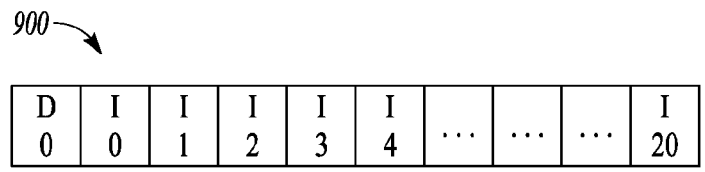
FIG. 9 illustrates an example attribute vector, in accordance with an example embodiment.

The block encoding vector generator module 614 may generate a block encoding vector 322, as described more fully below in conjunction with FIG. 9.

The split dictionary generator module 618 may generate a split dictionary, as described more fully below in conjunction with FIGS. 11 and 12.

The query execution module 622 may execute a query, as described more fully below in conjunction with FIGS. 13A-13B and 14A-14C.

Deciding the Split Condition

To determine the split condition, the mean length of the strings in the dictionary 300 and the standard deviation in these lengths may need to be computed. These statistics may be computed for the entire population directly in in-memory databases. Alternatively, in certain situations (like a disk-based database system or batch loading—growing dictionary scenarios), the system utilizes the statistics with sampling data to estimate the mean and standard deviation of substantially the entire population. In one example embodiment, a sample set from the entire population may be taken through random sampling and used to estimate the population mean using the Z-test and the standard deviation of the population using the Chi-square test.

1) Deciding the Split Dictionary Cut-Length

In one example embodiment, using the population mean and standard deviation, the percentage of population which falls in each category may be found:

$$m + K*s$$

where $K=1, 2, 3 \ldots$. Based on the above findings, the following steps may provide a generic approach to determine the cut length:

a) Based on the percentage division of population into different spreads, the memory and performance advantages for different values of 'K' may be computed. For the city dataset, the generated statistics (mean and standard deviation) may be as shown in the table of FIG. 2B. Based on these statistics, the memory and performance benefits according to the different values of 'K' can be computed.

b) Once the optimum 'K' value (for memory and performance level) is found, the system may simulate a dictionary split (the actual split is still not done) on the optimum 'K' value and may generate the block encoding vector 322 for the attribute vector (based on this simulated split).

c) Once the block encoding vector 322 is created, the system attempts to optimize the block encoding vector 322 to achieve scenario #1 (i.e., achieve a minimum number of mixed dictionary blocks and an equal number of major and minor dictionary blocks) as described above. This may be done by analyzing the current mix of different types of blocks and then shifting the K value so as to reach a mix closest to scenario #1.

d) Once the optimal block proportions are found, the system may split the dictionaries at this final level of 'K', with the cut length of $m+K*s$.

Figure 7:
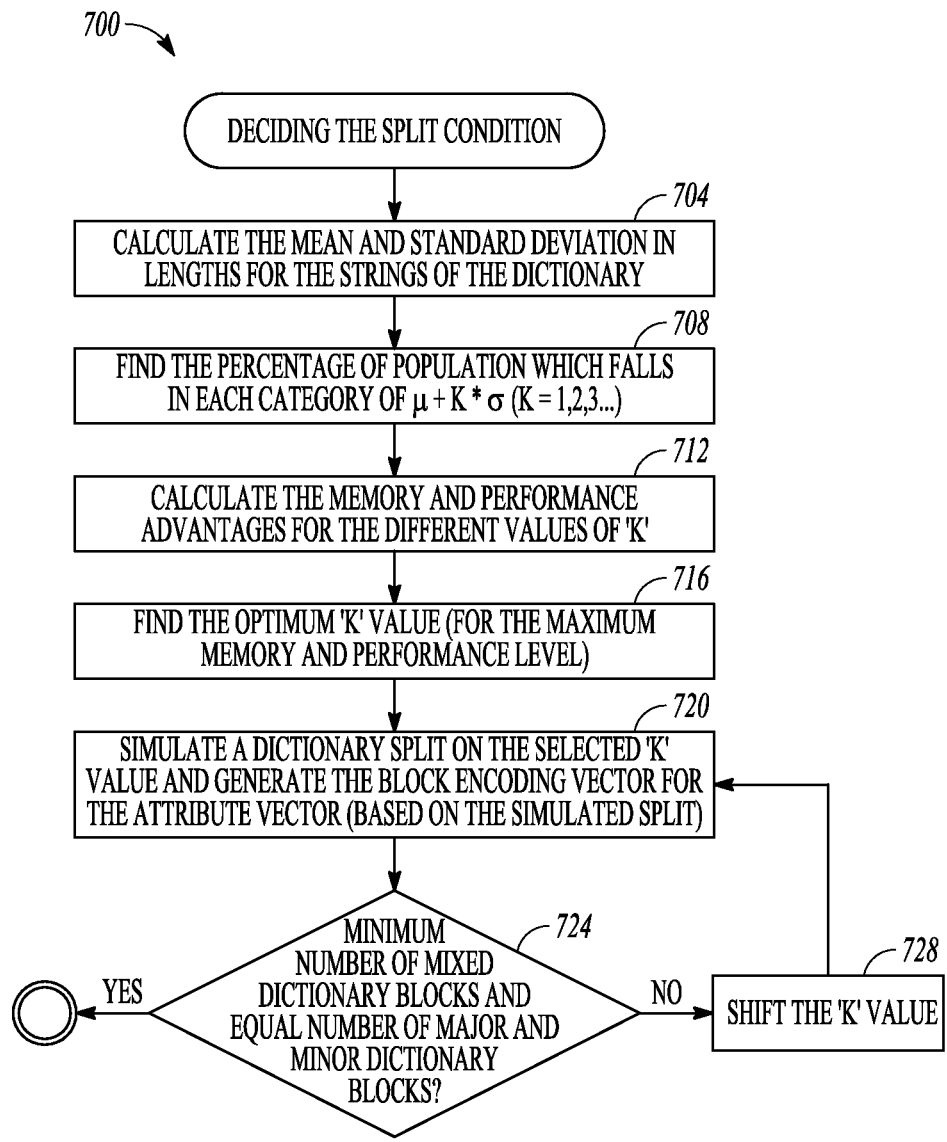
FIG. 7 is a flowchart for a first method for deciding a split condition, in accordance with an example embodiment.

FIG. 7 is a flowchart for a method 700 for deciding a split condition, in accordance with an example embodiment. In one example embodiment, one or more of the operations of the method 700 may be performed by the split condition determination module 610.

In one example embodiment, the mean and standard deviation of the lengths of the strings of the dictionary 300 may be computed (operation 704) and the percentage of the dictionary population that falls in each category of $\mu+K*\sigma$ (for $K=1, 2, 3\ldots$) may be computed (operation 708). The memory and performance advantages for different values of K may be determined (operation 712) and the optimal value of K in regard to memory and performance may be determined (operation 716).

In one example embodiment, the dictionary split based on the optimal value of K may be simulated and the block encoding vector 322 for the attribute vector may be generated based on the simulated dictionary split (operation 720). A test may be performed to determine if a minimum number of mixed dictionary clusters and an equal number of major and minor dictionary blocks have been defined (operation 724). If a minimum number of mixed dictionary clusters and an equal number of major and minor dictionary blocks have been defined, the method may end; otherwise, the value of K may be shifted (operation 728) and the method may proceed with operation 720.

Figure 8:
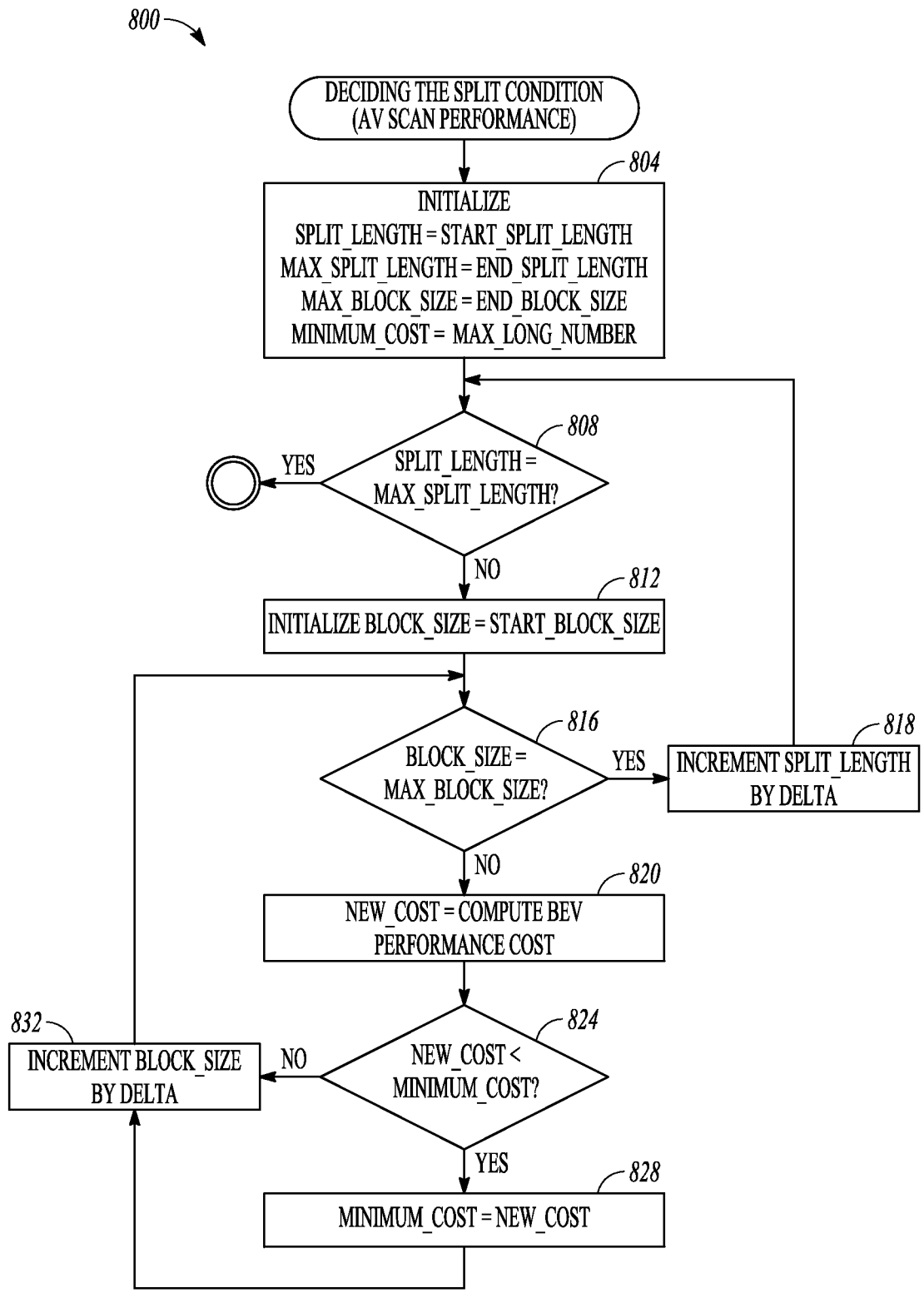
FIG. 8 is a flowchart for a second method for deciding a split condition, in accordance with an example embodiment.

In one example embodiment, the optimal split length and block size for a given AV may be determined by the following steps.

a) The system continuously reiterates over the AV with different split lengths (for, such as, from 10 to 100, at a step size of 10).

b) For each split length, the system loops over a number of block sizes (for, such as, from 1024 to 10240, at a step size of 1024) and re-generates the block encoding vector 322 for each block size.

c) For each block encoding vector 322, a memory cost may be calculated as described above and a performance cost, which is to be minimized, may be calculated according to the following formula:

BEV Performance Cost=(Total Major Dictionary Blocks+Total Mixed Dictionary Blocks)*Major Dictionary Count+(Total Minor Dictionary Blocks+Total Mixed Dictionary Blocks)*Minor Dictionary Count FIG. 8 is a flowchart for a second method 800 for deciding a split condition, in accordance with an example embodiment. The method 800 may enhance AV performance while selecting the block size and split length. In one example embodiment, one or more of the operations of the method 800 may be performed by the split condition determination module 610.

In one example embodiment, the Split_Length, Max_Split_Length, Max_Block_Size, and Minimum_Cost variables may be initialized (operation 804). For example, the Split_Length may be initialized to ten, the Max_Split_Length may be initialized to 100, the Max_Block_Size may be initialized to 1024, and the Minimum_Cost variable may be initialized to the value of the Max_Long_Number. A test may be performed to determine if the Split_Length equals the Max_Split_Length (operation 808). If the Split_Length equals the Max_Split_Length, the method may end; otherwise, the variable Block_Size may be set equal to Start_Block_Size. For example, the variable Block_Size may be set equal to 1024 (operation 812).

A test may be performed to determine if the variable Block_Size equals the Max_Block_Size (operation 816). If the variable Block_Size equals the Max_Block_Size, the variable Split_Length may be incremented by the value Delta (e.g., the value ten) (operation 818) and the method may proceed with operation 808; otherwise, the performance cost (New_Cost) of the block encoding vector 322 may be computed (operation 820).

A test may be performed to determine if the variable New_Cost is less than the variable Minimum_Cost (operation 824). If the variable New_Cost is less than the variable Minimum_Cost, then the variable Minimum_Cost is set equal to the variable New_Cost (operation 828) and the method may proceed with operation 832; otherwise, the method may proceed with operation 832.

During operation 832, the variable Block_Size may be incremented by the value Delta (e.g., the value 1024) and the method may proceed with operation 816.

Dictionary Encoding Integer Identifiers for the Attribute Vector

In a conventional dictionary encoding implementation, the attribute vector may simply store the implicit memory offset of the strings in the dictionary 300 as integer identifiers. In one example embodiment of the split dictionary approach, the integer identifiers for both of the dictionaries may be continuous, i.e. the attribute vector may perceive the dictionary as one contiguous table. For example, as shown in the table of FIG. 4, the attribute vector may store the integer identifiers from 1 to 997,000 for the major dictionary table and may store the integer identifiers from 997001 to 1000000 for the minor dictionary table. In such a case, the integer identifiers for the major dictionary 314 are simply the memory offset of the strings in the major dictionary 314, and the integer identifiers for strings in the minor dictionary 310 are calculated as:

Integer IDs for minor table=Number of total strings in major dictionary+Memory offset in minor dictionary The maintenance overhead of using continuous integer identifiers is consistent with existing systems like SAP HANA of SAP AG of Walldorf, Germany. When a new unique string is inserted in either the major or minor dictionary 314, 310, the memory offsets of the existing strings change, as new strings may be added in between existing strings in order to keep the dictionary sorted. This may lead to a large number of updates in the attribute vector, as the entire set of integers below this new entry may need to be updated by one.

Allocating an Extra Bit to the Integer Identifier to Identify Referenced Dictionary As illustrated in the table of FIG. 2A, 20 bits are needed per integer identifier in the example attribute vector. In one example embodiment, an additional bit may be added to specify which dictionary table is to be referenced. FIG. 9 illustrates an example attribute vector, in accordance with an example embodiment. For example, as illustrated in FIG. 9, the $D_0$ bit may be used as a selection variable for the dictionaries 310, 314, where a value of 0 signifies a lookup in the major dictionary 314 and a value of 1 specifies a lookup in the minor dictionary 310. The extra bit may be useful during dictionary updates, as the minor dictionary 310 does not get impacted with changes in the major dictionary 314 (and vice versa). Therefore, the attribute vector only has to update the corresponding integer identifiers of the altered dictionary 310, 314.

Thus, the first approach does not need any extra memory, but may have a higher cost for dictionary updates. The second approach of creating independent dictionaries may lead to efficient updates, but with an additional cost in terms of memory.

Figure 10:
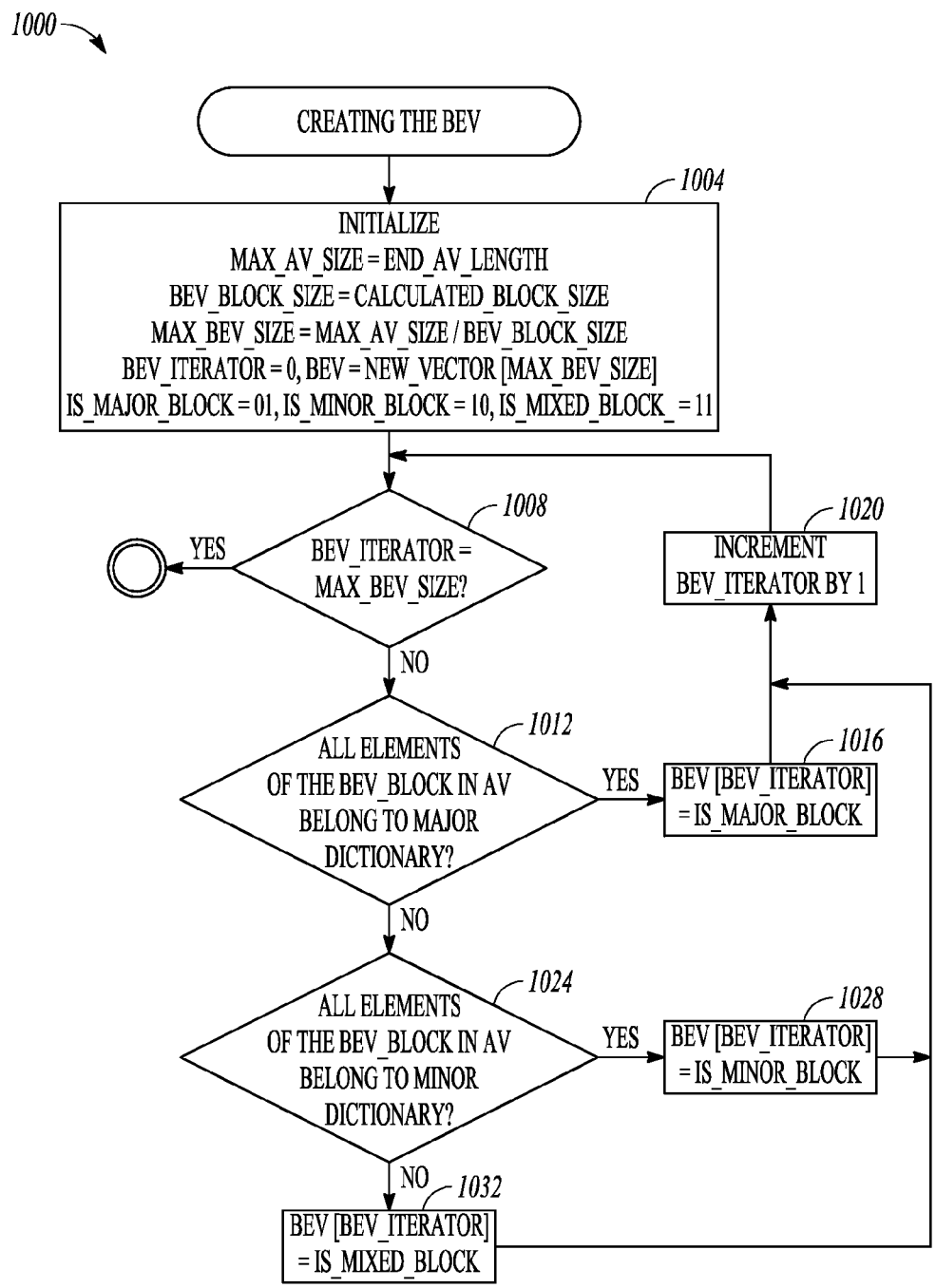
FIG. 10 is a flowchart for a method for generating a block encoding vector, in accordance with an example embodiment.

FIG. 10 is a flowchart for a method 1000 for generating a block encoding vector 322, in accordance with an example embodiment. In one example embodiment, one or more of the operations of the method 1000 may be performed by the block encoding vector generator module 614.

In one example embodiment, the Max_AV_Size, BEV_Block_Size, Max_BEV_size, BEV_Iterator, Is_Major_Block, Is_Minor_Block, and Is_Mixed_Block variables may be initialized (operation 1004). For example, the Max_AV_Size may be initialized to End_AV_Length (e.g., one billion), BEV_Block_Size may be initialized to Calculated_Block_Size (e.g., 1024), Max_BEV_size may be initialized to Max_AV_size/BEV_Block_Size, BEV_Iterator may be initialized to zero, BEV may be initialized to BEV=New_Vector[Max_BEV_Size], Is_Major_Block may be initialized to 01, Is_Minor_Block may be initialized to 10, and Is_Mixed_Block may be initialized to 11.

A test may be performed to determine if BEV_Iterator equals the Max_BEV_Size (operation 1008). If BEV_Iterator equals the Max_BEV_Size, the method may end; otherwise, a test may be performed to determine if all the elements of the BEV_Block in AV belong to the major dictionary 314 (operation 1012).

If all the elements of the BEV_Block in AV belong to the major dictionary, then BEV[BEV_Iterator] is set to Is_Major_Block (operation 1016) and the BEV_Iterator variable may be incremented by one (operation 1020). The method may then proceed with operation 1008.

If all the elements of the BEV_Block in AV do not belong to the major dictionary 314, a test may be performed to determine if all the elements of the BEV_Block in AV belong to the minor dictionary 310 (operation 1024). If all the elements of the BEV_Block in AV belong to the minor dictionary 310, then BEV[BEV_Iterator] is set to Is_Minor_Block (operation 1028) and the BEV_Iterator variable may be incremented by one (operation 1020). The method may then proceed with operation 1008.

If all the elements of the BEV_Block in AV do not belong to the minor dictionary 310, then BEV[BEV_Iterator] is set to Is_Mixed_Block (operation 1032) and the BEV_Iterator variable may be incremented by one (operation 1020). The method may then proceed with operation 1008.

Figure 11:
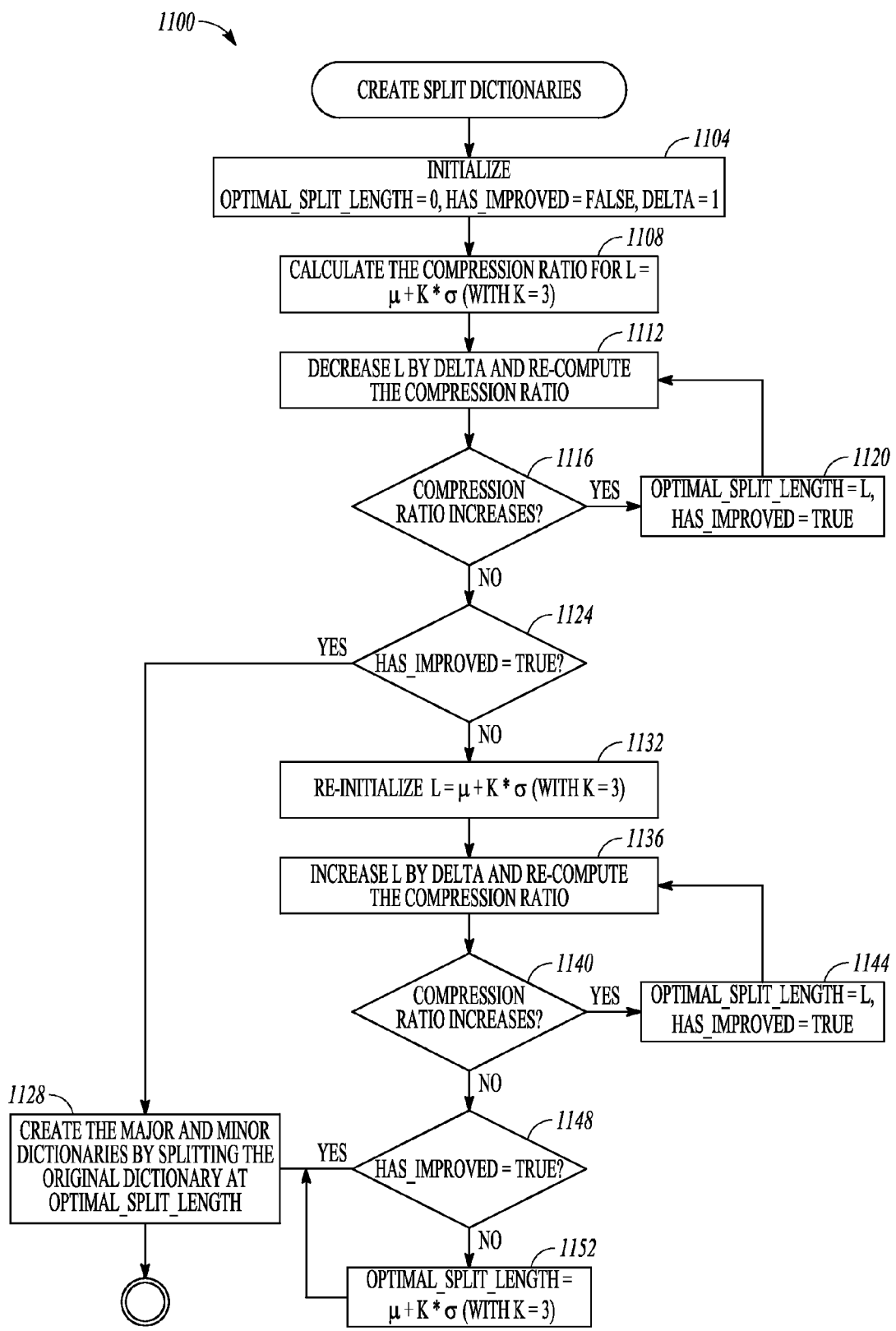
FIG. 11 is a flowchart for a method for creating split dictionaries using a compression-oriented approach, in accordance with an example embodiment.

FIG. 11 is a flowchart for a method 1100 for creating split dictionaries using a compression-oriented approach, in accordance with an example embodiment. In one example embodiment, one or more of the operations of the method 1100 may be performed by the split dictionary generator module 618.

According to the empirical rule, almost 99% of records in the dictionary 300 should have a length less than $L=\mu+K*\sigma$, where K=3 and L is the Cut_Length. In one example embodiment, the compression ratio for the split dictionary approach at L=µ+K*a may be computed as:

(Original Dictionary Count*Original Dictionary Length)/(Major Dictionary Count*Split Length+ Minor Dictionary Count*Original Dictionary Length)

The value of L may then be reduced by delta and the compression ratio may be re-computed. If the compression ratio increases, L may be decreased until it either becomes zero or the compression ratio value decreases instead of increasing. The L for the resulting compression ratio may be used to determine the optimal split length.

However, if after reducing L by delta, the compression ratio value decreases, then L may be increased by delta and the compression ratio may be re-computed. The value of L may be increased until the best compression ratio is found and the corresponding split length may be selected.

If, in both the cases of decreasing and increasing the L value by delta, the compression ratio decreases, then K=3 is the best case. The split length may then be set to L=m+3*s.

For the city dataset, the generated statistics (mean and standard deviation) are as shown in the table of FIG. 2B. Based on these statistics, the compression ratio (or memory saving percentage=1−1/compression ratio) may be computed according to the different values of 'K'.

In one example embodiment, the Optimal_Split_Length, Has_Improved, and Delta variables may be initialized (operation 1104). For example, the Optimal_Split_Length may be initialized to zero, Has_Improved may be initialized to "false", and Delta may be initialized to one. The compression ratio for L (i.e., Compression_Ratio_L) may then be calculated (operation 1108), where $$\text{Compression\_Ratio\_}L = \mu + K^*\sigma.$$

L may be decreased by delta and the compression ratio for L may be re-computed (operation 1112).

A test may be performed to determine if the compression ratio has increased (operation 1116). If the compression ratio has increased, Optimal_Split_Length is set to L and Has_Improved is set to "true" (operation 1120). The method may proceed with operation 1112.

If the compression ratio has not increased, a test may be performed to determine if Has_Improved equals "true" (operation 1124). If Has_Improved equals "true", the major and minor dictionaries may be created by splitting the original dictionary at Optimal_Split_Length (operation 1128). The method may then end.

If Has_Improved equals "false", the compression ratio for L (i.e., Compression_Ratio_L) may then be reinitialized (operation 1132), where $$\text{Compression\_Ratio\_}L = \mu + K^*\sigma.$$

L may be increased by delta and the compression ratio for L may be re-computed (operation 1136).

A test may be performed to determine if the compression ratio has increased (operation 1140). If the compression ratio has increased, Optimal_Split_Length is set to L and Has_Improved is set to "true" (operation 1144). The method may proceed with operation 1136.

If the compression ratio has not increased, a test may be performed to determine if Has_Improved equals "true" (operation 1148). If Has_Improved equals "true", the major and minor dictionaries may be created by splitting the original dictionary at Optimal_Split_Length (operation 1128). The method may then end.

If Has_Improved equals "false", Optimal_Split_Length is set to L=µ+K*σ, where K=3 (operation 1152). The method may proceed with operation 1128.

Figure 12:
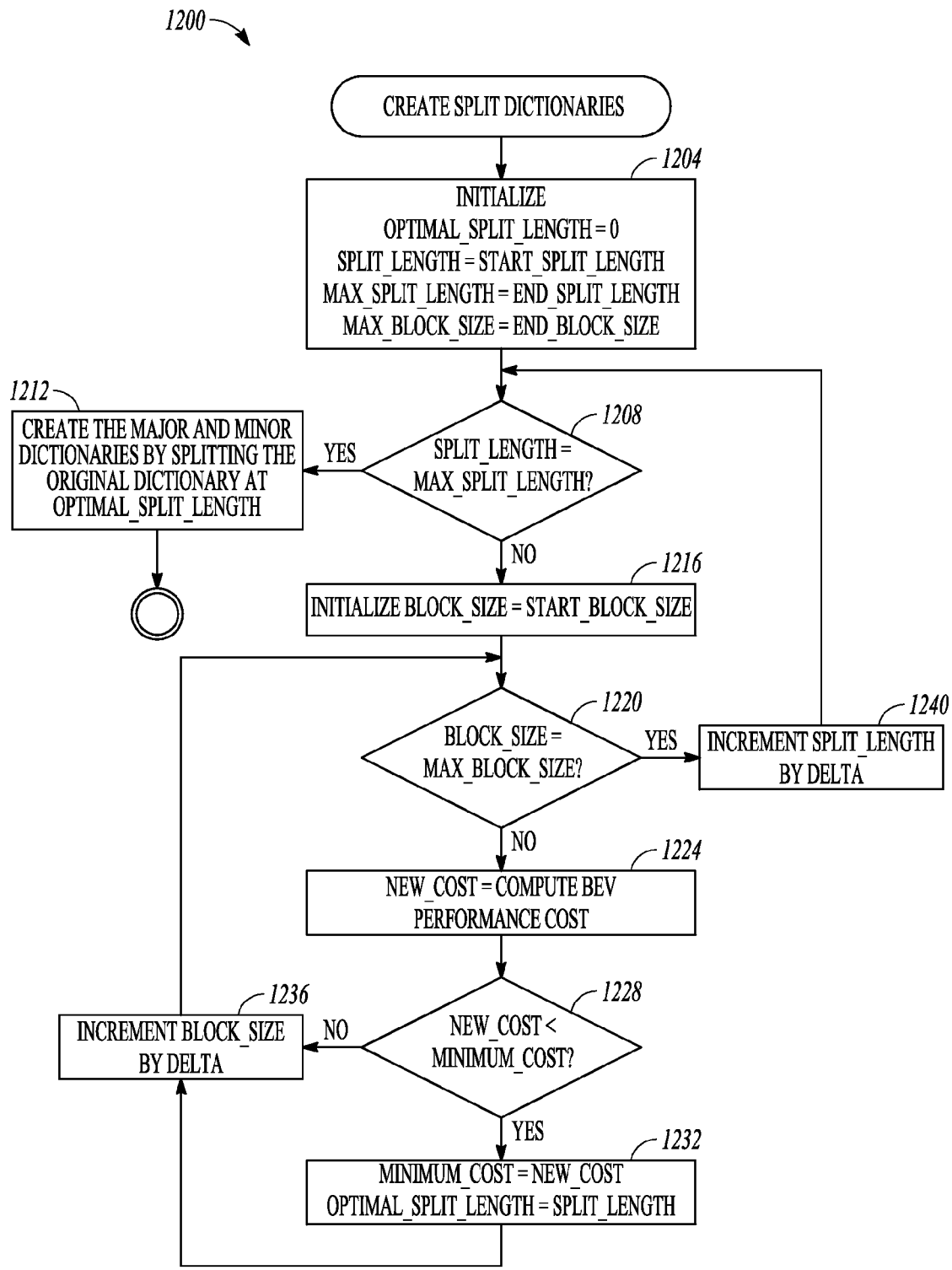
FIG. 12 is a flowchart for a method for creating split dictionaries using a performance-oriented approach, in accordance with an example embodiment.

FIG. 12 is a flowchart for a method 1200 for creating split dictionaries using a performance-oriented approach, in accordance with an example embodiment. FIG. 12 shows the flow of the steps to attain optimized AV performance while selecting the block size and split length. In one example embodiment, one or more of the operations of the method 1200 may be performed by the split dictionary generator module 618.

In one example embodiment, the system continuously iterates over the AV with different split lengths (for example, from 10 to 100, at a step size of 10). For each split length, the system loops over a number of block sizes (for example, from 1024 to 10240, at a step size of 1024) and re-generates the BEV for each block size. The aim is to reach scenario #1 described above. Therefore, for each BEV, a performance cost, which is to be minimized, is calculated according to the following formula:

BEV Performance Cost=(Total Major Dictionary Blocks+Total Mixed Dictionary Blocks)*Major Dictionary Count+(Total Minor Dictionary Blocks+Total Mixed Dictionary Blocks)*Minor Dictionary Count In one example embodiment, the Optimal_Split_Length, Split_Length, Max_Split_Length, and Max_Block_Size variables may be initialized (operation 1204). For example, Optimal_Split_Length may be initialized to zero, Split_Length may be initialized to Start_Split_Length (e.g., 10), Max_Split_Length may be initialized to End_Split_Length (e.g., 100), and Max_Block_Size may be initialized to End_Block_Size (e.g., 1024).

A test may be performed to determine if Split_Length equals Max_Split_Length (operation 1208). If Split_Length equals Max_Split_Length, the major and minor dictionaries may be created by splitting the original dictionary at Optimal_Split_Length (operation 1212). The method may then end.

If Split_Length does not equal Max_Split_Length, Block_size may be initialized to Start_Block_Size (e.g., 1024) (operation 1216).

A test may be performed to determine if Block_Size equals Max_Block_Size (operation 1220). If Block_Size equals Max_Block_Size, Split_Length may be incremented by Delta (operation 1240) and the method may proceed to operation 1208. If Block_Size does not equal Max_Block_Size, the BEV performance cost is computed and New_Cost is set to the computed BEV performance cost (operation 1224).

A test may be performed to determine if New_Cost is less than Minimum_Cost (operation 1228). If New_Cost is not less than Minimum_Cost, Block_Size may be incremented by Delta (operation 1236) and the method may proceed with operation 1220. If New_Cost is less than Minimum_Cost, Minimum_Cost is set to New_Cost and Optimal_Split_Length is set to Split_Length (operation 1232) and the method may proceed with operation 1236.

Either the compression-oriented approach or the performance-oriented approach work well in case the user has only a single goal to achieve, i.e., better compression or better performance. In most cases, however, the system administrator would want to achieve the best trade-off between compression ratio and performance of the system. In such a case, a threshold level can be defined for both the factors of compression and performance and the above steps can be adequately modified to decide the split length in light of the threshold levels.

Updating Multiple Dictionaries

In some example embodiments, enterprise database systems may not be frequently updated; only 5% of the dictionary data may change over time. This may make it easier to maintain a dictionary in sorted form.

A delta store may be maintained for fast write operations. Instead of directly updating the compressed data, which may be slow, faster uncompressed delta caches (known as L1-delta & L2-delta) may be maintained and may be write optimized. Write operations may only be performed on the delta storage. The changes may then be transferred to the main storage through a process called delta merge. In the case of dictionary compression, the dictionaries of two delta structures are computed (only for L1-delta) and sorted (for both L1-delta and L2-delta), and merged with the main dictionary on the fly.

For a split dictionary implementation, the insert and delete queries may still be made in the delta store only. The delta merge process, however, may need to be modified such that, instead of merging the delta dictionaries with the main dictionary, the merge is done to the appropriate dictionary (major or minor dictionary 314, 310) on the same premise of length of string being lesser than or greater than m+K*s.

With changes in a dictionary, the database manager may need to be updated. For example, as shown in the table of FIG. 4, a unique string in the major dictionary 314 may be added at memory offset 150000 in the major dictionary 314. In the present example, this increases the size of the major dictionary 314 to 997001.

In the case of a split dictionary approach with continuous integer identifier mapping, this may affect all of the integer identifiers in the attribute vector which are greater than 150000, i.e., from 150000 to 1000000. In the split dictionary approach with an extra bit for integer identifier mapping, this may only affect the major table entries in the attribute vector, i.e., from 150000 to 997001 (the minor table entries remain unchanged).

Frequency of Split Condition Update

With updates in the dictionaries, the mean and standard deviation of lengths will change. Therefore the system should check and update the split condition during the lean/idle time periods. Due to this update, a few of the strings may need to be shifted from either the major dictionary 314 to the minor dictionary 310 or vice versa, resulting in re-sorting of the reorganized dictionary. Also, the attribute vector needs to be updated for both the dictionaries 310, 314 since the integer IDs change in both the dictionaries 310, 314.

For the enterprise dataset, however, the dictionary data may not change for some time. Also, since the total number of records may be in the millions, the addition of a relatively few new strings may not highly influence the computed mean and/or standard deviation.

Figure 13A:
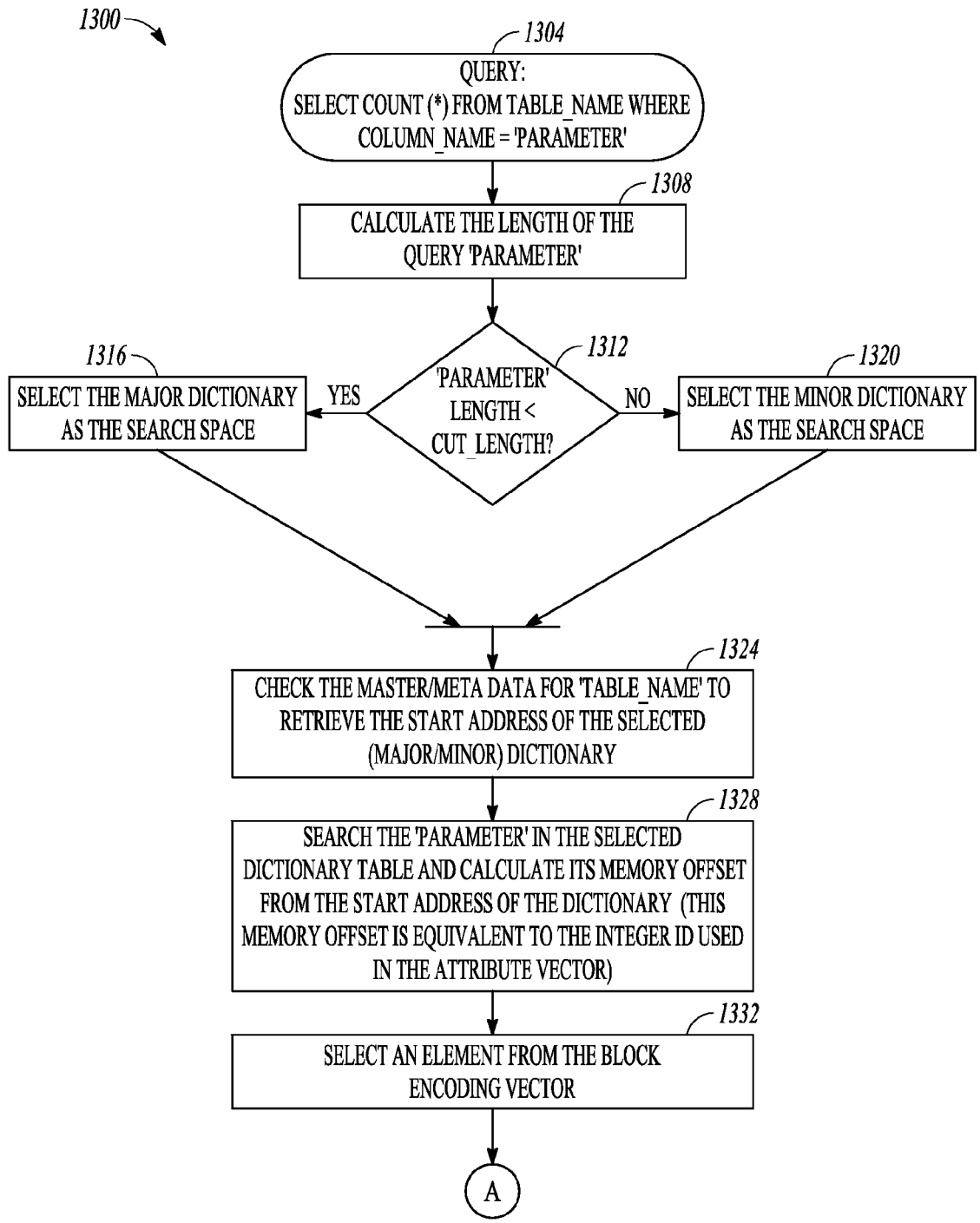
FIGS. 13A and 13B illustrate a flowchart for an example method for executing an exact string-matching query of a split dictionary, in accordance with an example embodiment.
Figure 13B:
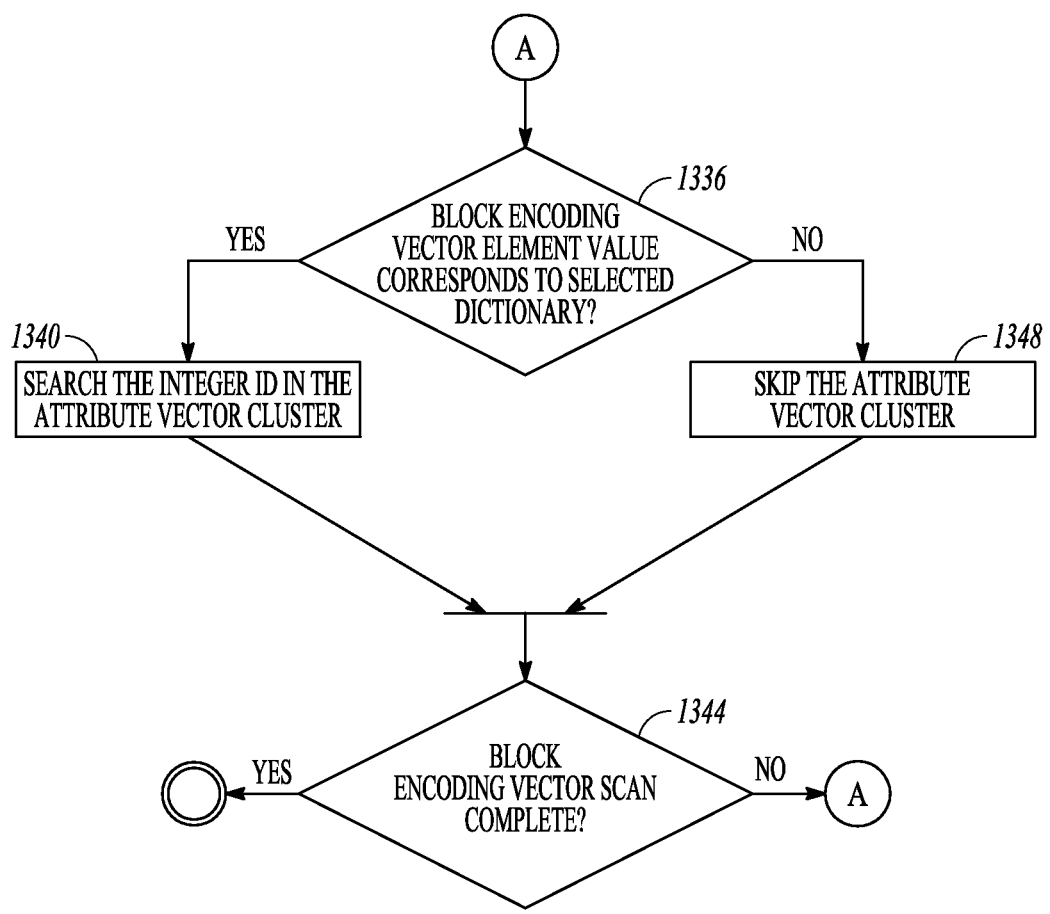

FIGS. 13A and 13B illustrate a flowchart for an example method 1300 for executing an exact string-matching query of a split dictionary, in accordance with an example embodiment. In one example embodiment, one or more of the operations of the example method 1300 may be performed by the query execution module 622.

In one example embodiment, a Count (*) may be selected from the table "Table_Name" where Column_Name is set to 'Parameter' (operation 1304). The length of the query 'Parameter' may be computed (operation 1308). A test may be performed to determine if the 'Parameter' length is less than the Cut_Length (operation 1312). If the 'Parameter' length is less than the Cut_Length, the major dictionary 314 may be selected (operation 1316) and the method may proceed with operation 1324; otherwise, the minor dictionary 310 may be selected (operation 1320) and the method may proceed with operation 1324.

In one example embodiment, the start address of the corresponding dictionary may be obtained (operation 1324). For example, a database manager may access a master metadata structure for "Table_Name" to retrieve the start address. The 'Parameter' may be searched for in the appropriate dictionary table and the corresponding memory offset from the start address of the dictionary may be computed (operation 1328). The memory offset is equivalent to the integer identifier used in the attribute vector.

An element may be selected from the block encoding vector 322 (operation 1332). The selected element may be tested to identify whether the selected element corresponds to the selected dictionary indicating that the corresponding attribute vector cluster from the attribute vector should be searched (operation 1336). If the selected element does not correspond to the selected dictionary, the attribute vector cluster may be skipped (operation 1348) and the method may proceed with operation 1344; otherwise, the corresponding attribute vector cluster is searched (operation 1340) and the method may proceed with operation 1344.

A test may be performed to determine if all elements of the block encoding vector 322 have been selected (operation 1344). If all of the elements of the block encoding vector 322 have been selected, the method may end; otherwise, the method may proceed with operation 1336.

Figure 14A:
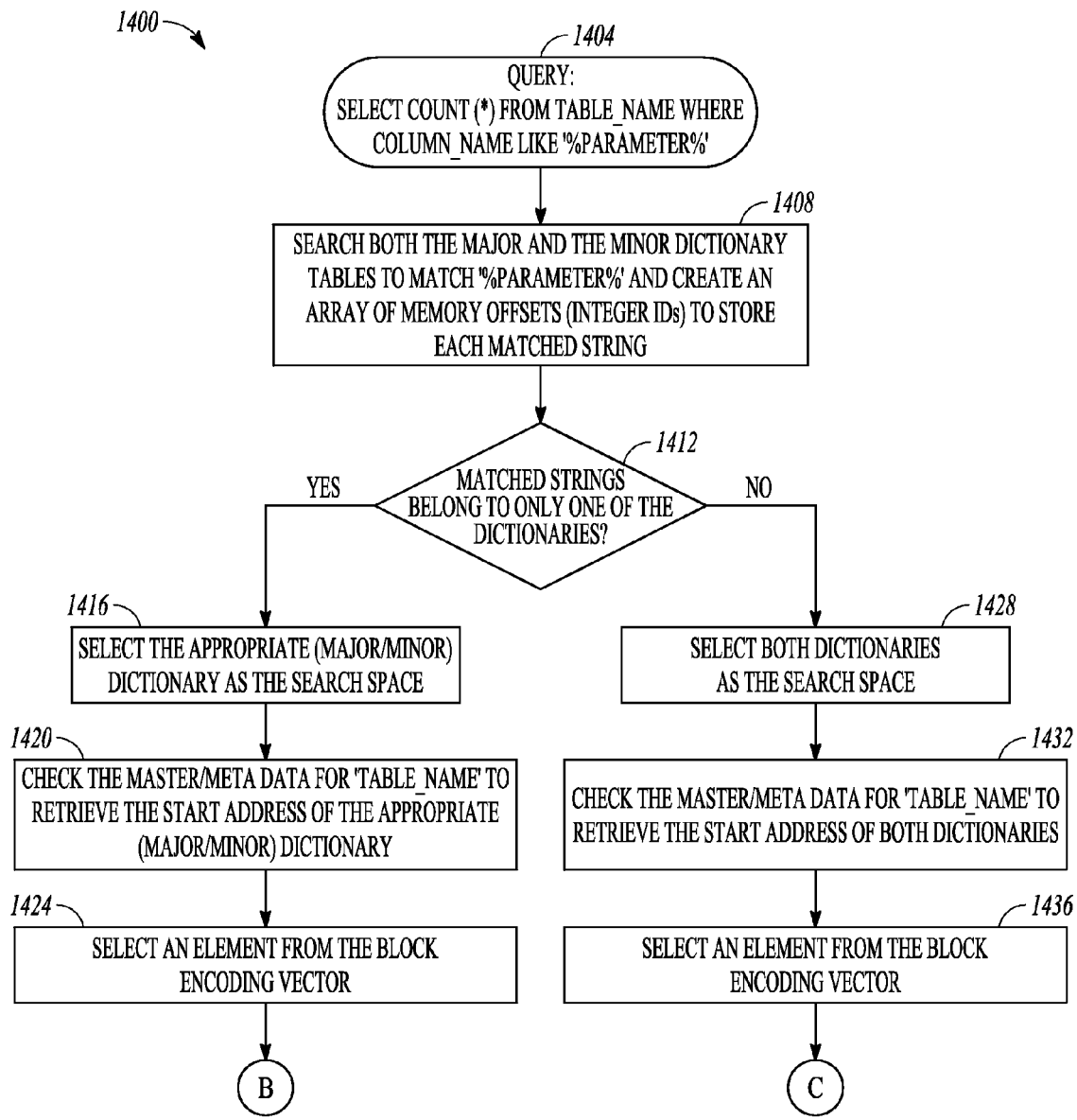
FIGS. 14A-C illustrate a flowchart for an example method for executing a wildcard string-matching query of a split dictionary, in accordance with an example embodiment.
Figure 14B:
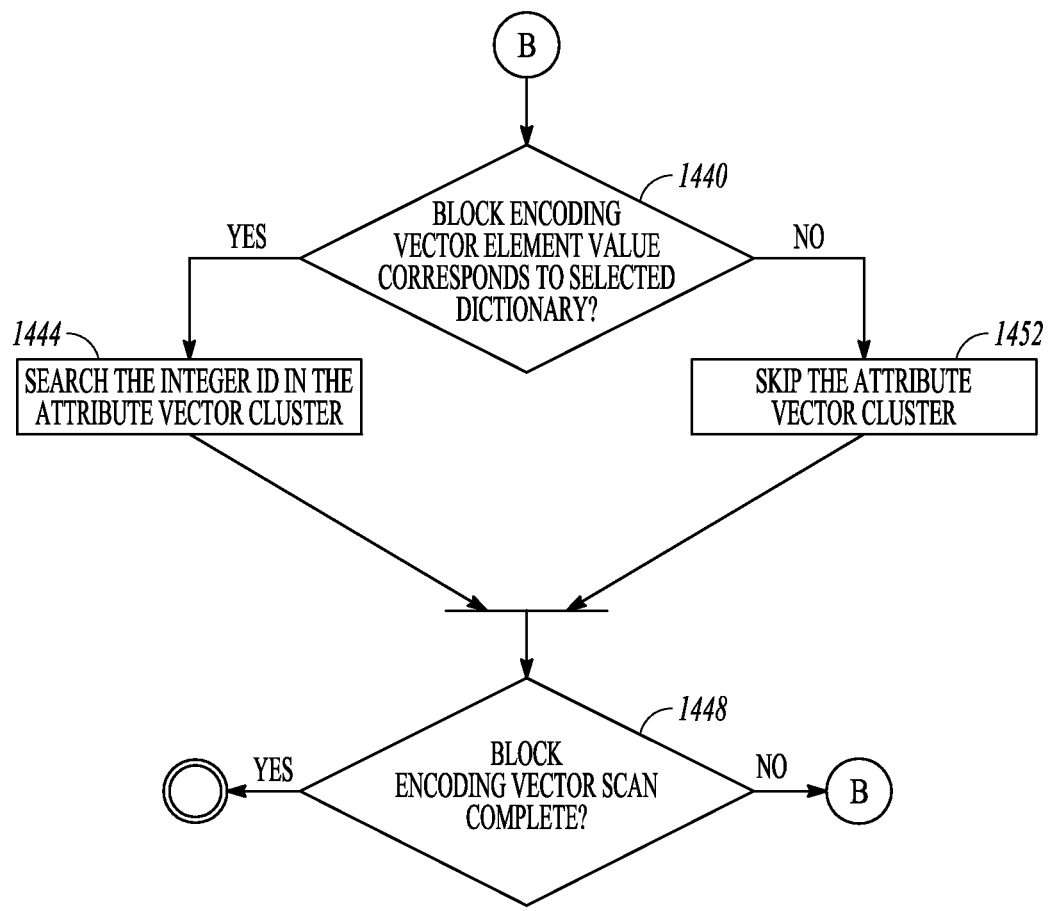
Figure 14C:
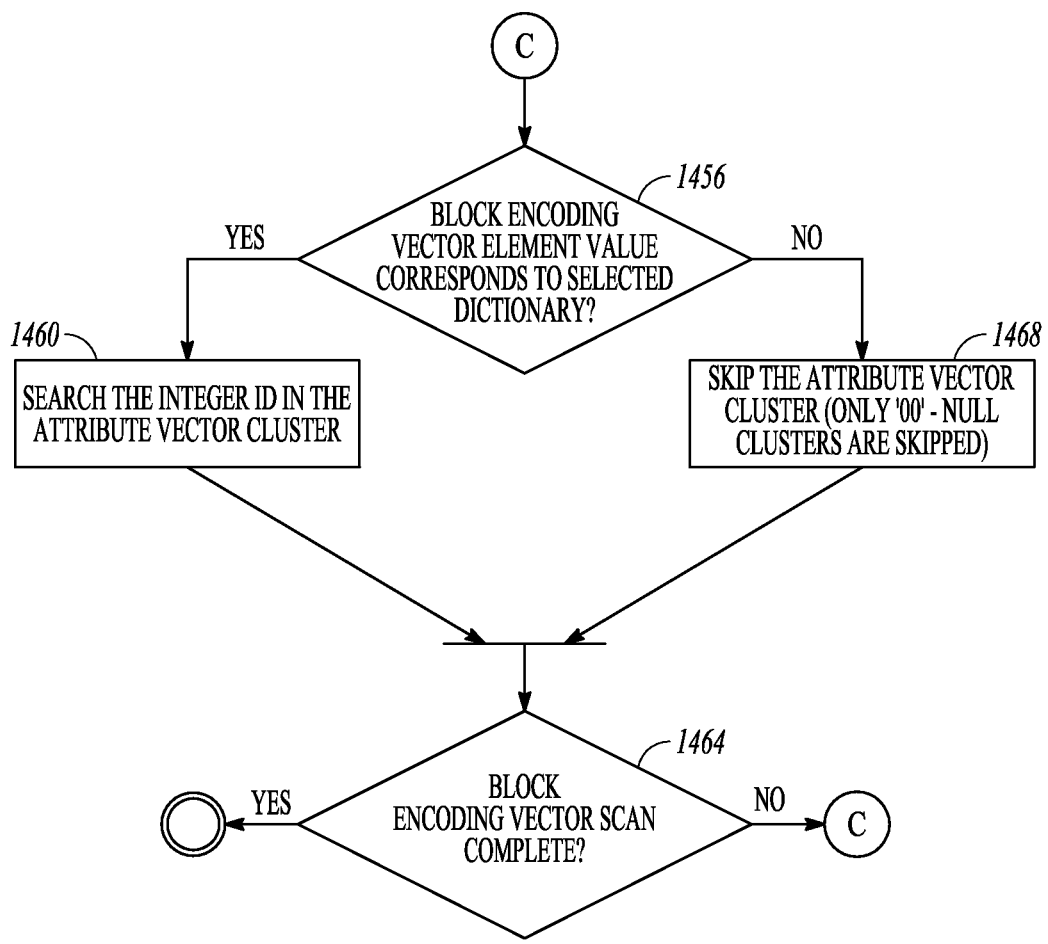

FIGS. 14A-14C illustrate a flowchart for an example method 1400 for executing a wildcard string-matching query of a split dictionary, in accordance with an example embodiment. In one example embodiment, one or more of the operations of the example method 1400 may be performed by the query execution module 622.

In one example embodiment, a Count (*) may be selected from the table "Table_Name" where Column_Name equals 'Parameter' (operation 1404). The major dictionary and minor dictionary tables may be searched for '%Parameter%' and an array of memory offsets (integer identifiers) to store each matched string may be created (operation 1408). A test may be performed to determine if the matched strings belong to only one of the major dictionary and minor dictionary tables (operation 1412). If the matched strings belong to only one of the major dictionary and minor dictionary tables, the method may proceed with operation 1416; otherwise, the method may proceed with operation 1428.

During operation 1416, the dictionary to which the matched string(s) belong may be selected. In one example embodiment, the start address of the corresponding dictionary may be obtained (operation 1420). For example, a database manager may access a master metadata structure for "Table_Name" to retrieve the start address.

An element in the block encoding vector 322 may be selected (operation 1424) and the selected element may be tested to identify whether the selected element corresponds to the selected dictionary indicating that the corresponding attribute vector cluster from the attribute vector should be searched (operation 1440). If the selected element does not correspond to the selected dictionary, the attribute vector cluster may be skipped (operation 1452) and the method may proceed with operation 1448; otherwise, the corresponding attribute vector cluster may be searched (operation 1444) and the method may proceed with operation 1448.

A test may be performed to determine if all elements of the block encoding vector 322 have been selected (operation 1448). If all of the elements of the block encoding vector 322 have been selected, the method may end; otherwise, the method may proceed with operation 1440.

During operation 1428, both the major dictionary 314 and the minor dictionary 310 may be selected as the search space. In one example embodiment, the start address(es) of both the major dictionary 314 and the minor dictionary 310 may be obtained (operation 1432). For example, a database manager may access a master metadata structure for "Table_Name" to retrieve the start address(es).

An element in the block encoding vector 322 may be selected (operation 1436) and the selected element may be tested to identify whether the selected element corresponds to the selected dictionary indicating that the corresponding attribute vector cluster from the attribute vector should be searched (operation 1456). If the selected element does not correspond to the selected dictionary, the attribute vector cluster may be skipped (operation 1468) and the method may proceed with operation 1464; otherwise, the corresponding attribute vector cluster may be searched (operation 1460) and the method may proceed with operation 1464.

A test may be performed to determine if all elements of the block encoding vector 322 have been selected (operation 1464). If all of the elements of the block encoding vector 322 have been selected, the method may end; otherwise, the method may proceed with operation 1456.

Space Optimization

Figure 15A:
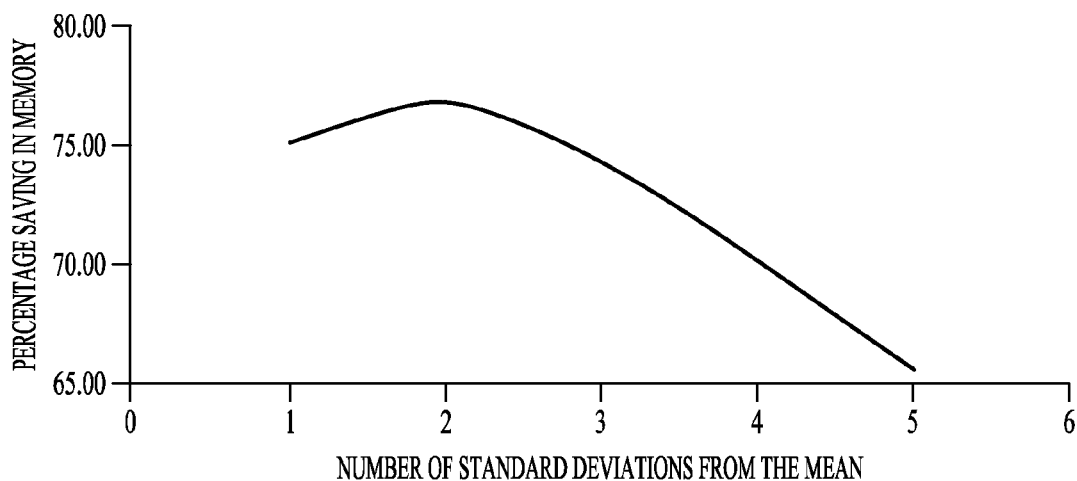
FIG. 15A shows how a percentage savings in memory may vary with the choice of the number of standard deviations considered for the city dataset of FIG. 3A.
Figure 15B:
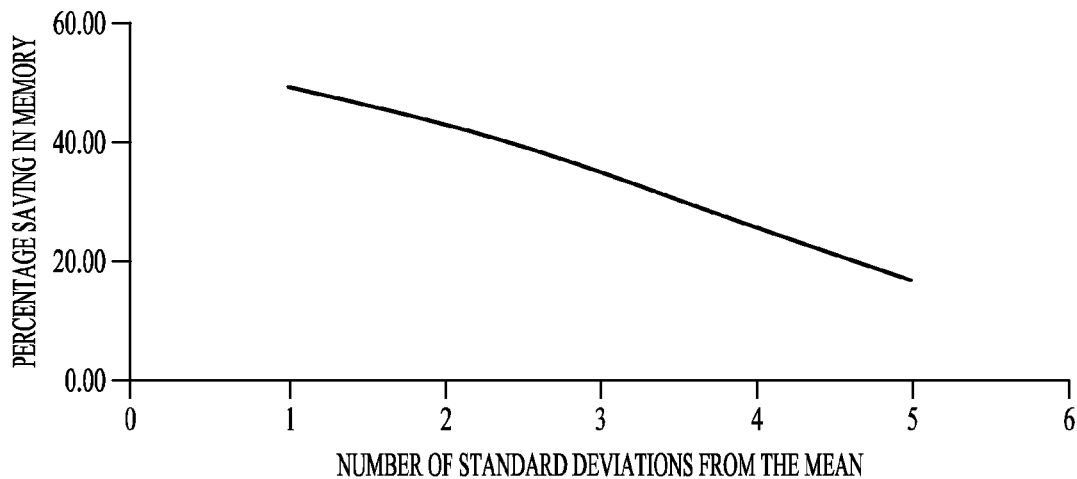
FIG. 15B shows how a percentage savings in memory may vary with the choice of the number of standard deviations considered for the names dataset.

The split dictionary approach may provide a high compression ratio due to reduced column width in the major dictionary 314. FIG. 15A shows how a percentage savings in memory may vary with the choice of the number of standard deviations considered for the city dataset of FIG. 3A. In the city dataset, memory savings in the range of 65% to 76% may be achieved, while varying the spread from (mean+1 sigma) (i.e., 15 bytes/characters) to (mean+5 sigma) (i.e., 32 bytes/characters). FIG. 15B shows how a percentage savings in memory may vary with the choice of the number of standard deviations considered for the names dataset. The names dataset may result in memory savings of almost 50% for the varying ranges, as illustrated in FIG. 15B. The differences in the observations of the two datasets may be attributed to the varying difference between the longest record length and the mean of lengths in the dictionary, which is approximately 80 (91-11) characters for the cities dataset, and approximately 10 (34-14) characters for the names dataset.

Time/Performance Optimization: Reverse Lookup Efficiency

Figure 15C:
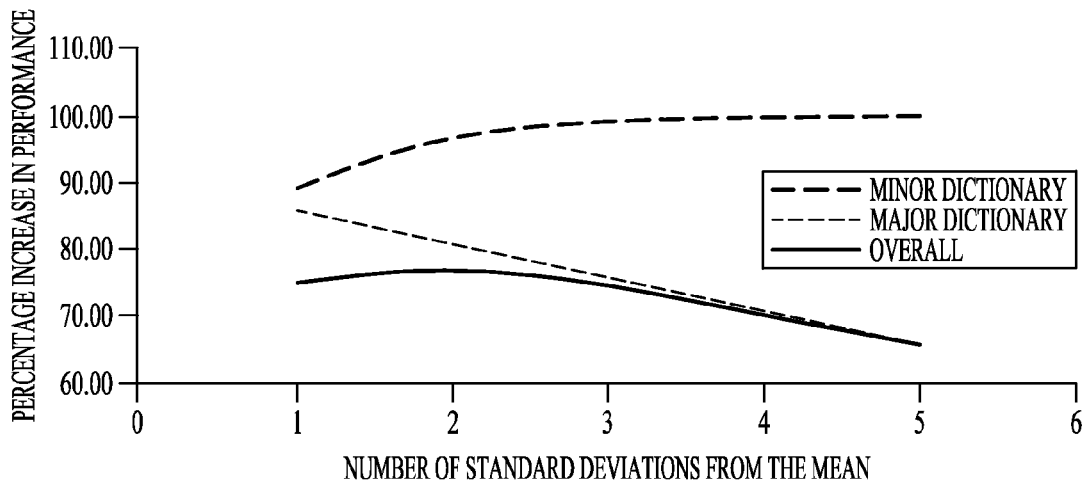
FIG. 15C shows how a percentage increase in performance may vary with the choice of the number of standard deviations considered for the city dataset.
Figure 15D:
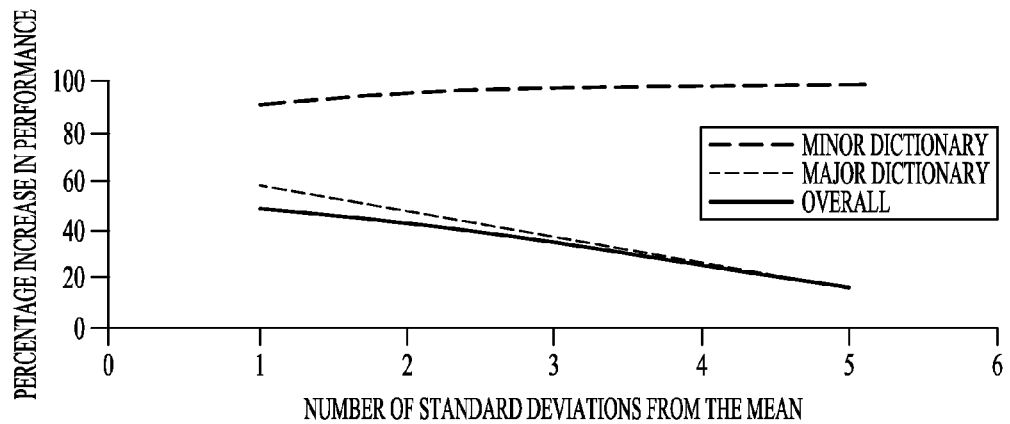
FIG. 15D shows how a percentage increase in performance may vary with the choice of the number of standard deviations considered for the names dataset.

Reverse lookup efficiency is the speed with which the database can find the corresponding integer identifier of a unique string in the dictionary. In the split dictionary approach, the database manager has pre-defined information about the column width of each of the dictionaries. As a result, searching a particular string may be easier, as only the appropriate dictionary (on the basis of query parameter length) needs to be searched. In the particular case of searching only the minor dictionary table, the response rate increases substantially (nearly 100%) as the search space is limited to only a few records. FIG. 15C shows how a percentage increase in performance may vary with the choice of the number of standard deviations considered for the city dataset. The split dictionary approach can improve the performance of a search query by 76%, as compared to the conventional approach of using a single dictionary. FIG. 15D shows how a percentage increase in performance may vary with the choice of the number of standard deviations considered for the names dataset. Even in the case of the names dataset, the search queries can perform better by up to, for example, 50%.

As a greater number of strings are shifted from the minor dictionary 310 to the major dictionary 314, the performance of the major dictionary 314 starts deteriorating, whereas the performance of the minor dictionary 310 nearly reaches 100%. This happens as the number of strings in the minor dictionary 310 falls below 0.1% of the total dictionary strings, resulting in a fast lookup.

Direct Access Advantage

An important factor to achieve high performance levels may be the ability to have direct dictionary access. Both the dictionaries 310, 314 in the split dictionary approach are of fixed length and thereby maintain direct access.

Attribute Vector Scanning Efficiency

In dictionary encoding approaches, database queries may be performed on the integer identifiers rather than the string values. Therefore, another aspect to consider while analyzing performance gain in the split dictionary approach is that of scanning the attribute vector values. In the block encoding vector 322 technique, there may be a definite improvement in the scan speeds. The percentage improvement, however, may vary substantially as the number of different types of blocks (minor, major, or mixed) varies.

Figure 15E:
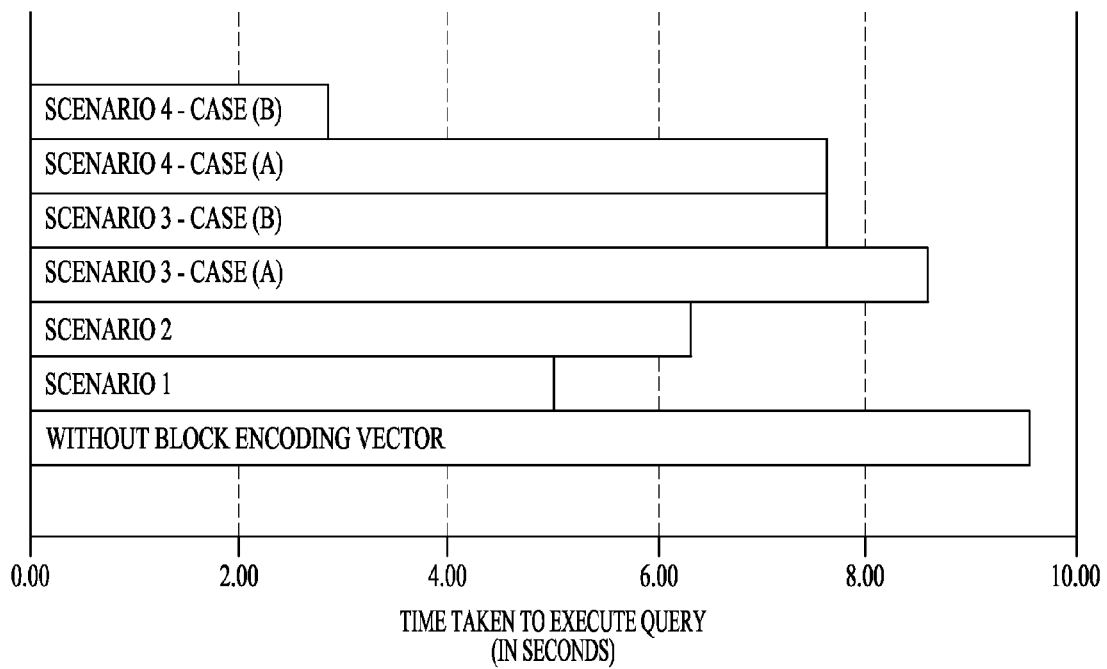
FIG. 15E shows a comparison of the time required to execute a search query.

An improvement of 70% for the scenario #4 may be attained, but only improvements in the range of 10-20% for the rest of the scenarios discussed above. FIG. 15E shows a comparison of the time needed to execute a search query in the different scenarios versus the case of not employing the block encoding vector 322 technique.

Improved Cache Utilization

The DRAM and cache capacity of conventional systems are limited. The reduction in storage requirements means the number of new cache loads may decrease, and the cache hit rate may improve. This may result in faster searching of strings in the column stores.

Faster Backup & Recovery

In-Memory database systems may have a backup mechanism to maintain high availability and fault tolerance. In SAP HANA, the snapshot approach may be used in which the data is backed up to an SSD (Solid State Drive) or an HDD (Hard Disk Drive) at regular intervals and only the log entries are replayed during recovery. With the reduced memory space of a dictionary, it is obvious that the time taken to perform the I/O (Input/Output) from in-memory systems may be faster for saving the information and the recovery process. While storing the dictionary and attribute values, the database may also backup the dictionary's metadata which may help with memory allocation needed while in recovery mode. Reduced memory usage may therefore lead to faster backups and/or recovery of data.

Easier Reconstruction of a Tuple

Unlike compression techniques like run-length encoding, cluster encoding, and the like, a split dictionary approach may not impact the attribute vector storage. Fixed column widths and row-ids of attribute vectors may be maintained (same as single dictionary approach). In the split dictionary approach, the integer identifiers may be mapped directly to the major or minor dictionary 314, 310. This may ensure a faster response during join operations over multiple columns for accessing the particular row (with row-id) and for fetching a unique string from the dictionary.

Improved Updates of Dictionary and Attribute Vector

The split dictionary approach may improve dictionary updates since the updates only impact one of the dictionaries 310, 314 and the relocation of strings (below the new entry) only needs to be done for one of the dictionaries 310, 314. Particularly in the case of updating the minor dictionary 310, there are significant improvements as the number of records in the minor dictionary 310 may be less than 1% of the total.

The updating of the integer identifiers in the attribute vector may also be improved, depending upon the implementation of the attribute vector mapping to the split dictionaries (as described above).

Advantages in Multi-Core Parallel Processing

For parallel processing, the attribute vector may be partitioned based on a fixed number of records and all the nodes may be run in parallel, for every query. With the usage of block encoding vector 322, there may be a possibility of wisely partitioning the attribute vector, such that a certain percentage of partitions are mapped to a particular dictionary only. The query may not be executed on all of the nodes, as the search parameter (integer identifiers) may map to only one of the dictionaries. This may help in running the query on dictionary specific nodes only, resulting in data locality as well as query load optimization.

Multi-Column Optimization

The BEV concept is independent for each column which can help multiple columns to leverage this advantage in parallel, without having to change row identifiers. The split approach can be used on multiple columns, resulting in optimized AV scanning, an advantage that may not be possible with known existing attribute vector compression techniques like prefix encoding, run length coding, cluster coding and sparse coding. Such compression techniques have a good compression ratio, but the overall performance may be impacted severely due to loss of row identifiers. Also, the key to achieving a high compression ratio may be dependent on the distribution of data and the best compression may be leveraged by sorting the complete AV and then applying one of the conventional compression techniques. Indirect coding algorithms try to address the row identifiers while encoding the values of each block with local dictionary. All these approaches work on a single column of the table and generally after applying the heuristic of compression across columns, one can choose the best fit column for applying these approaches individually or together. In this case, after sorting a single column of the table, the same cannot be applied to other columns, since there is no way of preserving the row identifiers across multiple compressed columns. Therefore, queries across multiple columns may not perform well. However, with the BEV approach, multiple (or all) columns of the table can be optimized simultaneously, thus resulting in an overall improved performance.

Figure 16:
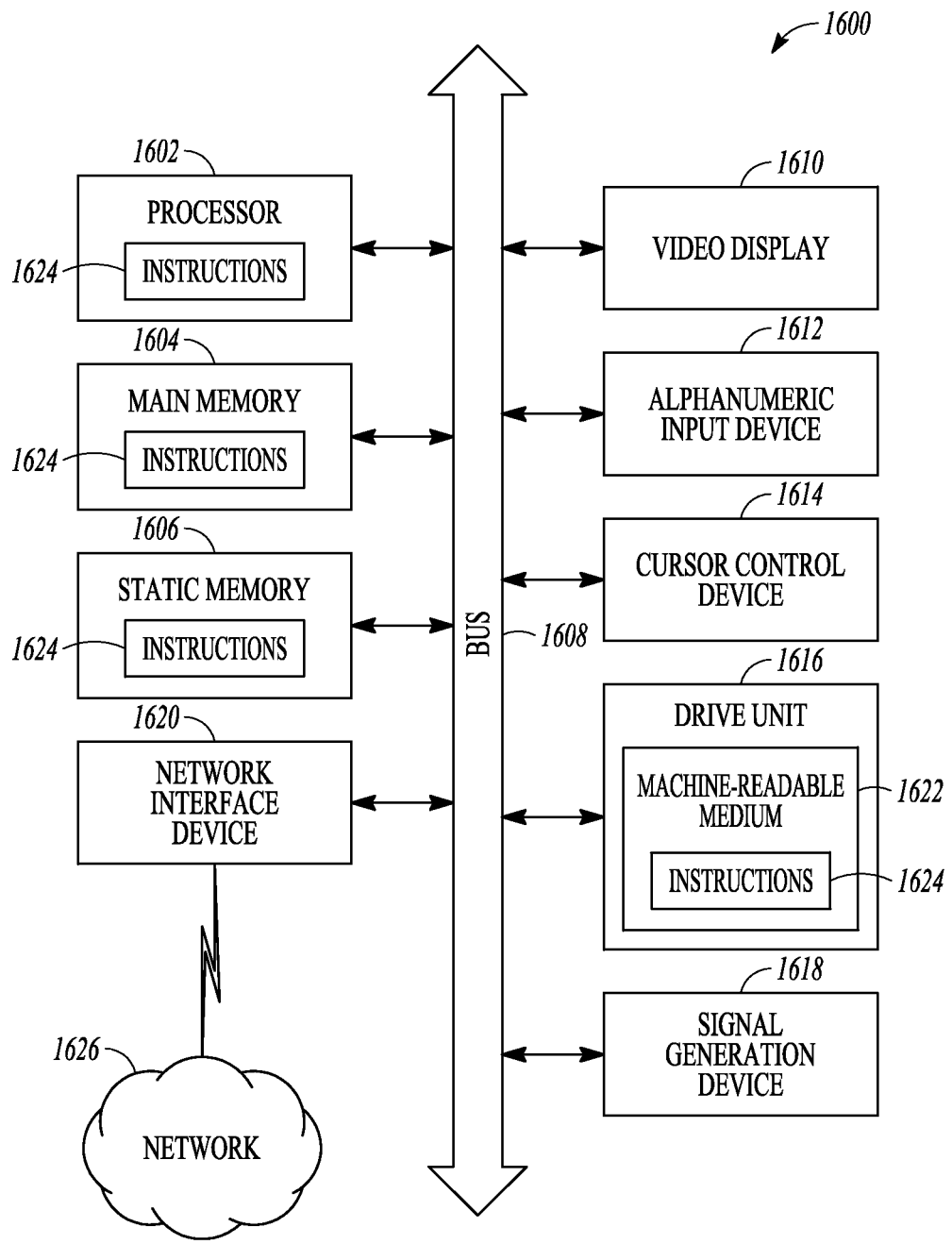
FIG. 16 is a block diagram of a computer processing system within which a set of instructions, for causing the computer to perform any one or more of the methodologies discussed herein, may be executed.

FIG. 16 is a block diagram of a computer processing system within which a set of instructions, for causing the computer to perform any one or more of the methodologies discussed herein, may be executed. In some embodiments, the computer operates as a standalone device or may be connected (e.g., networked) to other computers. In a networked deployment, the computer may operate in the capacity of a server or a client computer in server-client network environment, or as a peer computer in a peer-to-peer (or distributed) network environment.

In addition to being sold or licensed via traditional channels, embodiments may also, for example, be deployed by software-as-a-service (SaaS), application service provider (ASP), or by utility computing providers. The computer may be a server computer, a personal computer (PC), a tablet PC, a set-top box (STB), a personal digital assistant (PDA), cellular telephone, or any processing device capable of executing a set of instructions (sequential or otherwise) that specify actions to be taken by that device. Further, while only a single computer is illustrated, the term "computer" shall also be taken to include any collection of computers that, individually or jointly, execute a set (or multiple sets) of instructions to perform any one or more of the methodologies discussed herein.

The example computer processing system 1600 includes a processor 1602 (e.g., a central processing unit (CPU), a graphics processing unit (GPU) or both), a main memory 1604 and static memory 1606, which communicate with each other via a bus 1608. The computer processing system 1600 may further include a video display unit 1610 (e.g., a plasma display, a liquid crystal display (LCD) or a cathode ray tube (CRT)). The computer processing system 1600 also includes an alphanumeric input device 1612 (e.g., a keyboard), a user interface (UI) navigation device 1614 (e.g., a mouse, touch screen, or the like), a drive unit 1616, a signal generation device 1618 (e.g., a speaker), and a network interface device 1620.

The drive unit 1616 includes machine-readable medium 1622 on which is stored one or more sets of instructions 1624 and data structures embodying or utilized by any one or more of the methodologies or functions described herein. The instructions 1624 may also reside, completely or at least partially, within the main memory 1604, static memory 1606, and/or within the processor 1602 during execution thereof by the computer processing system 1600, the main memory 1604, static memory 1606, and the processor 1602 also constituting machine-readable, tangible media.

The instructions 1624 may further be transmitted or received over network 1626 via a network interface device 1620 utilizing any one of a number of well-known transfer protocols (e.g., Hypertext Transfer Protocol).

While the machine-readable medium 922 is shown in an example embodiment to be a single medium, the term "machine-readable medium" should be taken to include a single medium or multiple media (e.g., a centralized or distributed database, and/or associated caches and servers) that store the one or more sets of instructions 1624. The term "machine-readable medium" shall also be taken to include any medium that is capable of storing, encoding or carrying a set of instructions 1624 for execution by the computer and that cause the computer to perform any one or more of the methodologies of the present application, or that is capable of storing, encoding or carrying data structures utilized by or associated with such a set of instructions 1624. The term "machine-readable medium" shall accordingly be taken to include, but not be limited to, solid-state memories, and optical and magnetic media.

While the invention(s) is (are) described with reference to various implementations and exploitations, it will be understood that these embodiments are illustrative and that the scope of the invention(s) is not limited to them. In general, techniques for maintaining consistency between data structures may be implemented with facilities consistent with any hardware system or hardware systems defined herein. Many variations, modifications, additions, and improvements are possible.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements fall within the scope of the invention(s).

What is claimed is:

1. A computerized method for utilizing a split dictionary, the method comprising:
   computing a mean and a standard deviation of a length of a plurality of records in a dictionary;
   determining a split condition based on the computed mean and the computed standard deviation; and
   splitting the dictionary into a plurality of split dictionaries based on the split condition, wherein a first dictionary of the plurality of split dictionaries is a major dictionary comprising records having a length shorter than a threshold and a second dictionary of the plurality of split dictionaries is a minor dictionary comprising records having a length greater than or equal to the threshold.

2. The computerized method of claim 1, further comprising generating a block encoding vector, the block encoding vector comprising an encoding element for each of a plurality of clusters of integer identifiers within an attribute vector, the encoding element indicating an identification of one or more of the plurality of split dictionaries corresponding to the integer identifiers of the corresponding cluster.

3. The computerized method of claim 2, further comprising:
   obtaining a record length of a query term;
   determining an identity of a split dictionary corresponding to the obtained record length; and
   searching only clusters corresponding to the identified split dictionary based on the block encoding vector.

4. The computerized method of claim 1, wherein determining the split condition comprises:
   determining, for each of a plurality of different values of K, a percentage of records of the dictionary corresponding to each of a plurality of categories based on m+K*s, wherein m is a mean of a length of unique strings of records, s is a standard deviation in lengths of the unique strings of records, and K is a positive integer;
   computing a performance for each of the plurality of different values of K;
   ranking the computed performances; and
   selecting a value of K corresponding to a highest ranking performance.

5. The computerized method of claim 1, wherein determining the split condition comprises:
   computing a performance for each combination of a selected split length and a selected block size, wherein the selected split length is one of a plurality of candidate split lengths and the selected block size is one of a plurality of block candidate sizes;
   ranking the computed performances; and
   selecting a combination of split length and block size corresponding to a highest ranking performance.

6. The computerized method of claim 2, wherein one or more bits of each element of the attribute vector indicate an identification of a corresponding split dictionary.

7. The computerized method of claim 1, wherein the dictionary is compressed.

8. The computerized method of claim 1, wherein at least one of the plurality of split dictionaries is directly accessed.

9. The computerized method of claim 1, wherein the splitting the dictionary utilizes continuous dictionary blocks.

10. An apparatus for utilizing a split dictionary, the apparatus comprising:
    a processor;
    memory to store instructions that, when executed by the processor cause the processor to:
    compute a mean and a standard deviation of a length of a plurality of records in a dictionary;
    determine a split condition based on the computed mean and the computed standard deviation; and
    split the dictionary into a plurality of split dictionaries based on the split condition, wherein determining the split condition comprises:
    determining, for each of a plurality of different values of K, a percentage of records of the dictionary corresponding to each of a plurality of categories based on m+K*s, wherein m is a mean of a length of unique string of records, s is a standard deviation in lengths unique strings of records, and K is a positive integer;
    computing a performance for each of the plurality of different values of K;
    ranking the computed performances; and
    selecting a value of K corresponding to a highest ranking performance.

11. The apparatus of claim 10, wherein a first dictionary of the plurality of split dictionaries is a major dictionary comprising records having a length shorter than a threshold and a second dictionary of the plurality of split dictionaries is a minor dictionary comprising records having a length greater than or equal to the threshold.

12. The apparatus of claim 10, further comprising instructions that, when executed by the processor, cause the processor to generate a block encoding vector, the block encoding vector comprising an encoding element for each of a plurality of clusters of integer identifiers within an attribute vector, the encoding element indicating an identification of one or more of the plurality of split dictionaries corresponding to the integer identifiers of the corresponding cluster.

13. The apparatus of claim 12, further comprising instructions that, when executed by the processor, cause the processor to:
    obtain a record length of a query term;
    determine an identity of a split dictionary corresponding to the obtained record length; and
    search only clusters corresponding to the identified split dictionary based on the block encoding vector.

14. The apparatus of claim 10, wherein determining the split condition comprises:
    computing a performance for each combination of a selected split length and a selected block size, wherein the selected split length is one of a plurality of candidate split lengths and the selected block size is one of a plurality of block candidate sizes;
    ranking the computed performances; and
    selecting a combination of split length and block size corresponding to a highest ranking performance.

15. The apparatus of claim 12, wherein one or more bits of each element of the attribute vector indicate an identification of a corresponding split dictionary.

16. A non-transitory machine-readable storage medium comprising instructions that, when executed by one or more processors of a machine, cause the machine to perform operations comprising:
    computing a mean and a standard deviation of a length of a plurality of records in a dictionary;
    determining a split condition based on the computed mean and the computed standard deviation; and splitting the dictionary into a plurality of split dictionaries based on the split condition, wherein determining the split condition comprises:

computing a performance for each combination of a selected split length and a selected block size, wherein the selected split length is one of a plurality of candidate split lengths and the selected block size is one of a plurality of block candidate sizes;

ranking the computed performances; and selecting a combination of split length and block size corresponding to a highest ranking performance.

17. The non-transitory machine-readable storage medium of claim 16, further comprising instructions that, when executed by the processor, cause the processor to:

generate a block encoding vector, the block encoding vector comprising an encoding element for each of a plurality of clusters of integer identifiers within an attribute vector, the encoding element indicating an identification of one or more of the plurality of split dictionaries corresponding to the integer identifiers of the corresponding cluster.

18. The non-transitory machine-readable storage medium of claim 17, further comprising instructions that, when executed by the processor, cause the processor to:

obtain a record length of a query term;

determine an identity of a split dictionary corresponding to the obtained record length; and search only clusters corresponding to the identified split dictionary based on the block encoding vector.

* * * * *